United States Patent [19]

Sakata et al.

[11] Patent Number: 5,355,755
[45] Date of Patent: Oct. 18, 1994

[54] CIRCUIT BOARD TRIMMING APPARATUS AND METHOD

[75] Inventors: Yuji Sakata; Hidenori Sekiguchi; Fumio Tabata, all of Kawasaki, Japan

[73] Assignee: Fujitsu Limited, Kawasaki, Japan

[21] Appl. No.: 70,853

[22] Filed: Jun. 3, 1993

[30] Foreign Application Priority Data

| Jun. 4, 1992 | [JP] | Japan | 4-144525 |
| Jul. 13, 1992 | [JP] | Japan | 4-184240 |
| Oct. 1, 1992 | [JP] | Japan | 4-262613 |
| Apr. 20, 1993 | [JP] | Japan | 5-093382 |

[51] Int. Cl.⁵ .......... B24B 7/22; H05K 3/22; H01P 1/205
[52] U.S. Cl. .......... 83/875; 83/13; 83/701; 451/165
[58] Field of Search .......... 83/13, 875, 701; 29/867; 51/59 SS

[56] References Cited

U.S. PATENT DOCUMENTS

| 3,471,724 | 10/1969 | Balamuth | 51/59 SS |
| 3,909,911 | 10/1975 | Smith et al. | 29/867 |
| 4,409,659 | 10/1983 | Devine | 364/475 |
| 5,101,599 | 4/1992 | Takabayasi et al. | 51/59 SS |
| 5,177,902 | 1/1993 | Baba et al. | 51/59 SS |

FOREIGN PATENT DOCUMENTS

| 53-103578 | 9/1978 | Japan . |
| 3-57293 | 3/1991 | Japan . |
| 4-92502 | 3/1992 | Japan . |
| 4-92503 | 3/1992 | Japan . |

Primary Examiner—Hien H. Phan
Attorney, Agent, or Firm—Nikaido, Marmelstein, Murray & Oram

[57] ABSTRACT

It is an object of the present invention to provide a circuit board trimming apparatus and method used, in which apparatus and method a wiring pattern on a printed circuit board is trimmed, and to provide a circuit board trimming apparatus and method, in which apparatus and method a wiring pattern is trimmed efficiently while damage to the circuit board is minimized.

A force exerted by a cutter against the circuit board is measured when the wiring pattern is cut by pressing an ultrasonic cutter against the wiring pattern on the circuit board and by moving the circuit board and the cutter relative to each other, a shape of the wiring pattern being determined on the basis of the force thus measured and a cutting process being controlled in accordance with the shape of the wiring pattern.

33 Claims, 37 Drawing Sheets

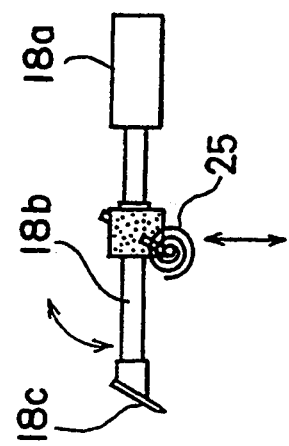
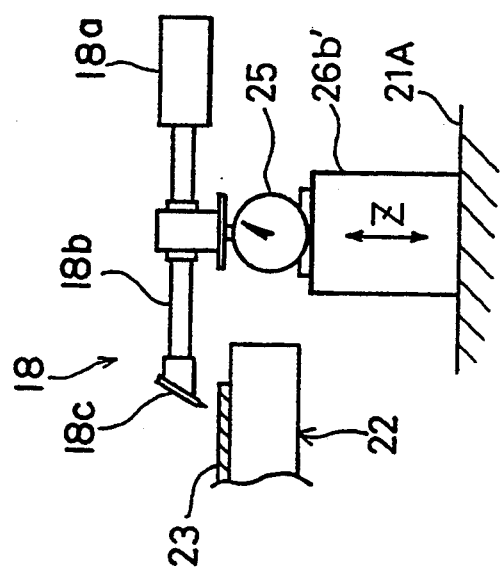
FIG.11(B)
FIG.11(A)

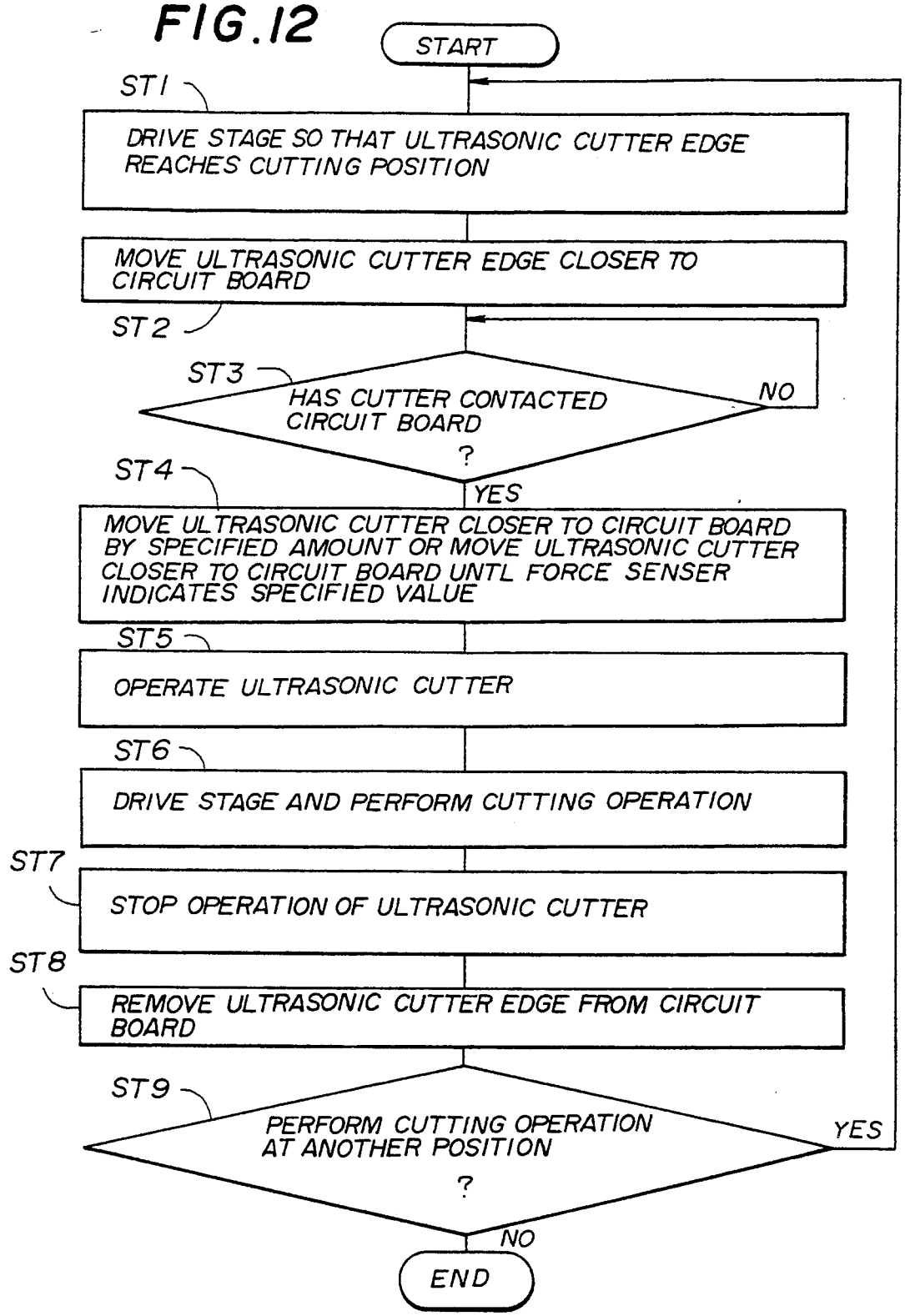

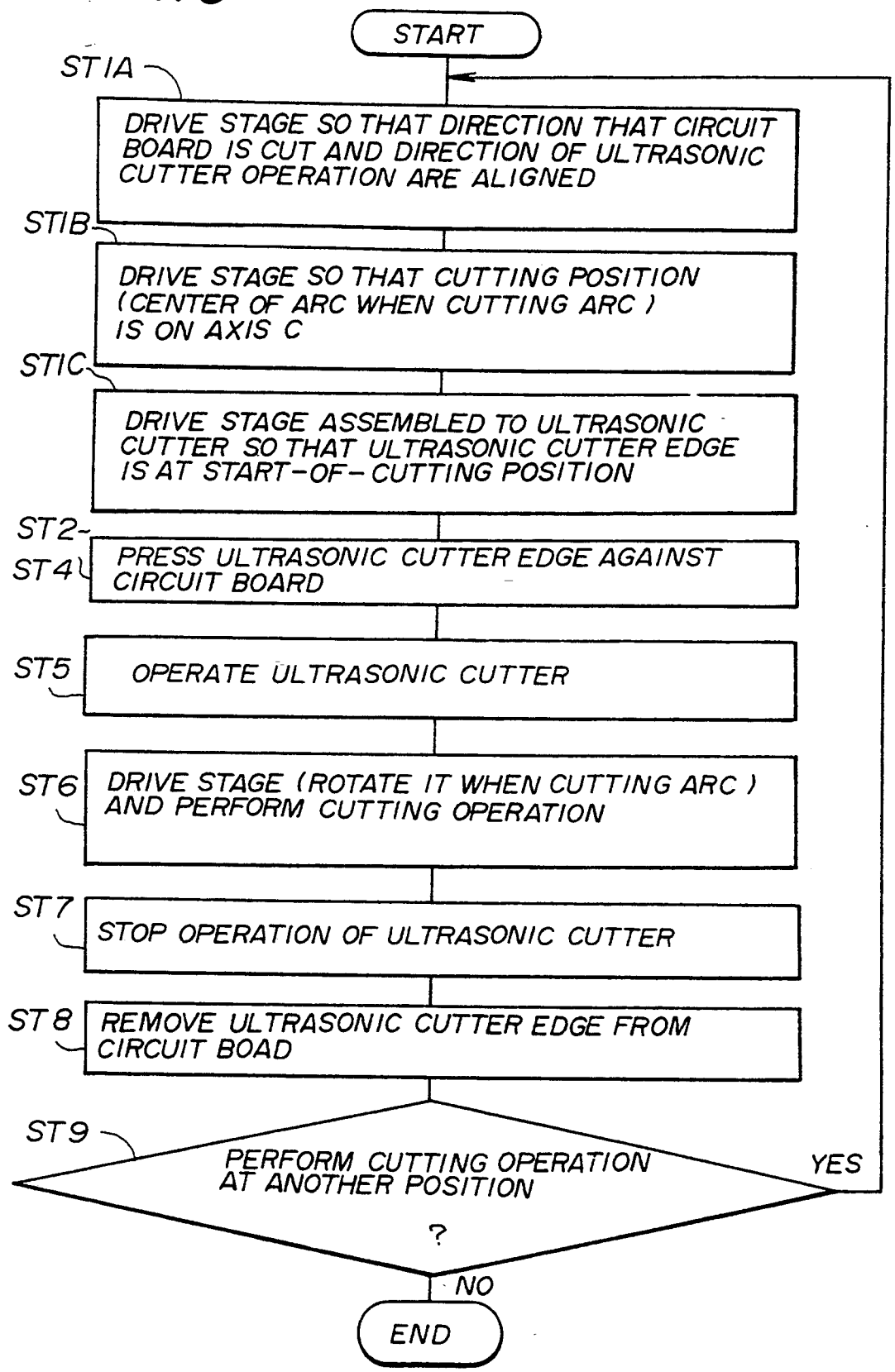

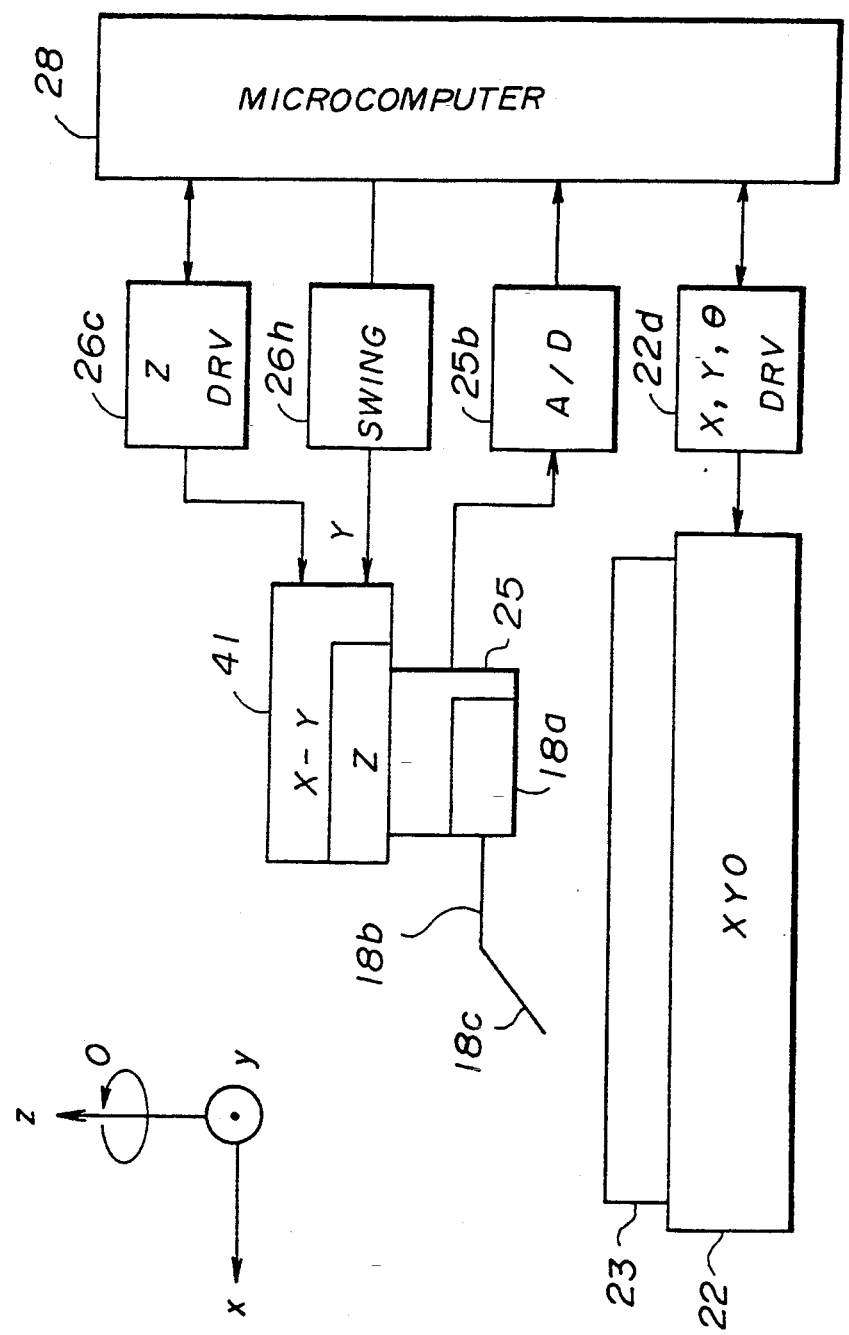

CIRCUIT BOARD TRIMMING APPARATUS AND METHOD

FIELD OF THE INVENTION

The present invention relates to the trimming of a printed circuit board and more particularly to an apparatus and method for trimming a wiring pattern formed on a printed circuit board.

BACKGROUND OF THE INVENTION

Electronic equipment, an example of which is a computer, generally uses a printed circuit board for the purpose of wiring various elements. In a printed circuit board, a wiring pattern is formed on an insulating substrate formed generally of a polyimide such that a conducting layer is formed by sputtering or plating and the layer is etched thereafter. It is required that information processing apparatuses today provide a high density of mounted elements in order to satisfy a need for smaller and faster operating apparatuses. As a result, wiring patterns formed on printed circuit boards today have a very fine and concentrated pattern. In an apparatus required to perform especially fast operations, such as a supercomputer, a multi-layer circuit board is employed for the purpose of minimizing length of wires in a wiring pattern.

Forming a fine wiring pattern on a circuit board is liable to produce errors during exposure process or during etching process, thus necessitating an introduction of technique for trimming a wiring pattern on a circuit board. In order to improve yield of the production process, circuit board trimming technique is essential with circuit boards produced through a large number of processes, such as multi-layer circuit boards having a high density of mounted elements and used in supercomputers and the like.

FIG. 1 and FIGS. 2(A), 2(B) show an example of multi-layer circuit board. FIG. 1 is a perspective view of the circuit board and FIGS. 2(A) and 2(B) are cross-sections.

Referring to FIG. 1, the multi-layer circuit board comprises: a polyimide layer 10 formed on a ceramic substrate (not shown in the figure) by spin coating means; and a first wiring pattern 11a formed on the polyimide layer 10. As shown in the cross-section of FIG. 2(A), the wiring pattern 11a is embedded in a first polyimide interlayer dielectric 11b. The layer 10, the wiring pattern 11a and the interlayer dielectric 11b constitute a first-layer structure 11 of the circuit board.

A second wiring pattern 12a is formed on the upper main surface of the interlayer dielectric 11b; a second interlayer dielectric 12b is formed so that the second wiring pattern 12a is embedded therein. Thus, the second-layer structure 12 of the circuit board is formed. As shown in FIG. 2(A), a viahole $13_1$ is provided in the interlayer dielectric 11b so as to connect the first wiring pattern 11a and the second wiring pattern 12a. A viahole $13_2$ is provided in the second interlayer dielectric 12b so that the second wiring pattern and a third wiring pattern formed on the interlayer dielectric 12b are electrically connected via the viahole $13_{12}$.

Since the interlayer dielectrics 11b and 12b are very thin (20–50 μm), a defect, such as a pinhole as indicated by a numeral 15 in FIG. 2(B), could cause the otherwise coated wiring pattern to be exposed. When a conducting layer is formed on the interlayer dielectric 12b so as to form the wiring pattern 14 thereon, the pinhole 15 becomes embedded in the conducting layer, possibly causing the wiring pattern 14 formed on the upper main surface of the interlayer dielectric 12b and the second wiring pattern 12 to be short-circuited. The likelihood of a short circuit becomes particularly great in a circuit board used in high-speed electronic devices, since spacings provided in a wiring pattern therein are small. In such a device, a minor error in an exposure process or etching process might even lead to a short-circuited wiring pattern in a layer.

In order to improve yield in producing circuit boards and in order to lower the cost of electronic apparatuses, a technique is required for trimming a circuit board where a short circuit as described above is created. FIGS. 3(A), 3(B), FIGS. 4(A), 4(B) and FIGS. 5(A), 5(B) show examples of trimming a wiring pattern on a circuit board. FIGS. 3(A) and (B) show an example of how an interlayer short circuit is trimmed; FIGS. 4(A) and 4(B) show an example of how an intra-layer short circuit is trimmed; and FIGS. 5(A) and 5(B) show an example of trimming a wiring pattern provided to penetrate a multi-layer circuit board in such a manner that the pattern is clear of a power source pattern. In the case of the example shown in FIGS. 3(A) and 3(B), the wiring pattern 12a short-circuited due to the pinhole 15 shown in FIG. 3(A) is trimmed by detaching the part in contact with the pinhole 15 from the other parts, as shown in FIG. 3(B). In the case shown in FIGS. 4(A) and 4(B), a short-circuited part 16a shown in FIG. 4(A) is trimmed by being cut out as shown in FIG. 4(B). In the case shown in FIGS. 5(A) and 5(B), a short-circuited part 12x between a pattern 12a', provided to penetrate the layers constituting a multi-layer circuit board as shown in FIG. 5(A), and a power source pattern 12a, provided to surround the pattern 12a' via the insulating region 12b, is cut and thus removed as shown in FIG. 5(B).

Conventionally, such trimming of a wiring pattern on the circuit board has been carried out manually by an expert. However, a board having highly-concentrated patterns such as the circuit boards used in today's high-speed information processing apparatuses has such a narrow patterning width (20–50 μm) that manual trimming has become almost impossible to perform. Although a method has been proposed for cutting out a defective part by using a high-power laser, such a method is liable to cause a damage to a polyimide insulating coat and is impractical because it requires delicate adjustment of irradiation power.

The Japanese Laid-Open Patent Publication 3-57293 proposes a method of cutting out a defective wiring pattern using an ultrasonic cutter in order to resolve the problem of trimming the circuit board pattern. FIG. 6 shows an example of how a defective pattern is trimmed according to the above-mentioned known art. In the figure, those parts that correspond to those in the figures already explained are given the same reference numerals from figure to figure.

Referring to FIG. 6, the above-mentioned known art uses a cutter 18 having a cutting edge 18c is used to cut out a defective pattern indicated by a numeral 12x. The cutting edge 18c is provided with ultrasonic oscillation by an excitation part 18a via an oscillation transmitting part (horn) 18b. The defective pattern 12x is cut and thus removed, by applying the cutting edge 18c to the pattern to be cut, and by moving the circuit board (11+12) in a direction V coinciding with the direction of the ultrasonic oscillation indicated by an arrow in the oscillation transmitting part 18b. Typically, an ultrasonic oscillation having a frequency in the order of several tens of a kHz is supplied to the cutter 18 so as to apply, to the cutting edge thereof, an ultrasonic oscillation having an amplitude of between several microns to several tens of micron.

FIG. 7(A) shows an example of trimming a wiring pattern on a circuit board where an apparatus according to the above-mentioned known art is employed. Referring to FIG. 7(A), the cutting edge 18c of the ultrasonic cutter 18 is lowered below the upper surface of the pattern 12a by a depth $Z_1$ and the pattern 12a is scraped by the depth $Z_1$ by moving the circuit board (11+12) in a direction indicated by an arrow V. This process is repeated until the pattern 12a is completely removed. According to the aforementioned known art, the pattern 12a can be removed by a width b corresponding to a width B of the cutting edge 18c, thus greatly improving yield in producing the circuit board.

According to the known method mentioned above, the position of the cutting edge 18c determines the depth of cutting. It is to be noted, however, that warp or irregularity of the dimension of more than 10 $\mu$m may exist on the printed circuit board. Such a warp or irregularity causes the relative position of the cutting edge 18c with respect to the board to be altered. When there is a depression on the board, the cutting edge is positioned above the depression so that the pattern 12a can not be cut. On the other other hand, when the cutting edge meets a raised part, it cuts not only the pattern 12a but also the insulating coat 11b of the board. As shown in FIG. 9(A), a depression tends to be formed on the insulating layer 12b immediately above the viahole $13_1$. When a defective pattern 14x formed on such a depression is removed by means of an apparatus employing the above-mentioned known art, a problem results that a part of the pattern 14x remains unremoved, while the insulating layer 12b is scraped off to an undesired depth, as shown in FIG. 9(B). This is because the cutting edge 18c of the aforementioned known art can be moved only in the horizontal direction. A repetitive cutting operation for removing the residual of the pattern 14x causes the damage to the board to grow. Such a problem of circuit board damage becomes even more serious with multi-layer circuit board used in high-speed information processing apparatuses such as supercomputers.

It is also to be noted that, in the above-mentioned known art, it is assumed that the pattern is removed with the cutting depth $Z_1$ by feeding the cutting edge 18c with the cutting depth $Z_1$, as shown in FIG. 7(A). However, the cutting depth of an ultrasonic cutter varies due to change, through wear, of the state of the cutting edge, the manner in which the exchangeable cutting edge 18c is screwed to the oscillation transmitting part (horn) 18b, variation in the relative position of the cutting edge 18c with respect to the oscillation transmitting part 18b and temperature-induced variation in ultrasonic oscillation transmitted along the cutting edge. It happens, therefore, that, when the cutting depth is small, the pattern is not removed to the desired depth $Z_1$ even when the cutter is fed to the depth $Z_1$ in the direction toward the board as shown in FIG. 7(A), resulting in the pattern being removed only by the depth $Z_O$. In such a case, even after stepwise cutting operations, which feed the cutter below the surface of the board, causes a part of the pattern remains to be cut, as shown in FIG. 7(C). A further stepwise cutting operation intended to reach the desired depth and to prevent any part of the pattern from remaining unremoved, causes the damage to the insulating layer on the board to grow. Although this damage can be reduced by presetting the unit cutting amount $Z_1$ to be relatively small, such an arrangement causes the number of repetitive operations for removing the whole pattern to increase, thereby requiring a lot of time for a cutting process and reducing throughput of the repair process.

When removing conductor path bridges and normal wiring patterns having a known pattern thickness, the process can be achieved by presetting the unit cutting amount $Z_1$ such that $Z_1$ multiplied by the number of repetitive operations exceeds the pattern thickness. However, a defective part created by a short circuit has an unknown thickness and an unknown shape. Accordingly, the above-mentioned known art presets the number of repetitive operations to be five so that a pattern having a maximum thickness as shown in FIG. 8(A) can be cut. However, a more common type of defective part such as the one shown in FIG. 8(B) would require only two repetitive operations. That is, the five repetitive operations as shown in FIG. 8(A) is superfluous because three of the five operations do not make contact and are unnecessary. Generally speaking, it is impossible, by using the above-mentioned known art, to remove a defective pattern formed on a board having a complex surface shape or a defective pattern having a complex shape itself, while the damage to the board can be minimized.

SUMMARY OF THE INVENTION

Accordingly, it is a general object of the present invention to provide a novel and useful circuit board pattern trimming apparatus and method in which apparatus and method the above-mentioned problems are resolved.

A more specific object of the present invention is to provide a circuit board pattern trimming apparatus and method in which apparatus and method a defective pattern formed on the board can be removed efficiently, while minimizing damage to the board.

The above objects of the present invention are achieved by a circuit board trimming apparatus comprising: supporting means for supporting a circuit board; a cutter for cutting, after contacting a wiring pattern formed on the surface of said circuit board, the wiring pattern; driving means for relatively moving said cutter and supporting means so that said supporting means moves with respect to said cutter in such a manner that the supporting means moves in a direction at right angles to the direction parallel to the surface of said circuit board; and oscillating means for supplying ultrasonic oscillation to said cutter, said apparatus trimming a defect in a wiring pattern formed on the circuit board by relatively moving said cutter and circuit board and by cutting out the wiring pattern on the circuit board, said circuit board trimming apparatus further comprising:
detecting means for detecting a force applied by said cutter against said circuit board and for outputting an output signal indicative of said force; and
controlling means which, supplied with said output signal, controls said driving means on the basis of said output signal so as to control said force.

The aforementioned objects of the present invention are also achieved by a wiring pattern trimming method comprising the steps of:

(a) pressing a cutter given an ultrasonic oscillation against a wiring pattern formed on the surface of a circuit board; and (b) cutting out a defect included in said wiring pattern by moving said cutter with respect to said circuit board, said pressing step including a step of measuring a force exerted by said cutter on the surface of said circuit board, and said cutting step including a step of controlling said force to be at a specified level.

In accordance with one aspect of the invention, it is possible to firmly apply a cutting edge to a printed circuit board even when a relative position of the cutting edge with respect to the circuit board varies due to warp and irregularity of the circuit board, by employing a configuration in which a force between the cutter and the circuit board is measured before trimming a wiring pattern. It is also possible to minimize such problems as insufficient cutting of a pattern or damage to the circuit board.

In accordance with another aspect of the invention, it is possible to effect a real-time measurement of the shape of a defective pattern to be trimmed, and a measurement of a cutting depth, by measuring a force exerted by the cutter while, at the same time, the cutter is being moved. It is thus possible to perform an optimal amount of cutting irrespective of the shape of the defective pattern or irregularity in ultrasonic cutter performance.

In accordance with still another aspect of the invention, efficiency in a cutting operation is improved and throughput of the operation of apparatuses is improved because a cutting amount is not excessively repressed and repetitive cutting operations are performed as many times as required.

In accordance with still another aspect of the invention, a force of exerted by the cutter can be set at a required level in a minimum period of time by moving the cutter toward the circuit board while measuring the force.

In accordance with still another aspect of the invention, an inertia of a dynamic system comprising a cutter, an arm cooperating with the cutter and a detecting means, by using, as the detecting means, a torque sensor for measuring a torque applied to the cutter. It is possible, accordingly, to minimize a contamination of an output signal by a noise caused, for example, by external oscillation.

In accordance with still another aspect of the invention, it is possible to effectively remove a minute defect created when trimming a circuit board, such as a burr, by setting a force of a cutter to be at a reduced level, such setting being achievable because the force can be monitored and controlled by using the circuit board trimming apparatus of the present invention.

In accordance with still another aspect of the invention, it is possible to remove a pattern by a width greater than the width of a cutter, by moving the cutter with respect to a circuit board in a first direction parallel to the surface of the circuit board, by applying to the cutter a first ultrasonic oscillation oscillating in the first direction while at the same applying a second ultrasonic oscillation oscillating in a second direction which is at right angles to the first direction and is parallel to the circuit board.

In accordance with still another aspect of the invention, it is possible to determine, irrespective of the condition of a cutting edge, a cutting condition indicating the relationship between a force of a cutter and a cutting amount, by allowing the cutter to cut out a pattern formed on a circuit board and having a specified size. An optimal cutting operation is thus possible by controlling the force in accordance with the cutting condition thus determined.

Other objects and further features of the present invention will be apparent from the following detailed description when read in conjunction with the accompanying drawings.

BRIEF DESCRIPTION OF THE DRAWINGS

FIGS. 11(A) and 11(B) show other configurations of a force detecting mechanism shown in FIG. 10(B);

FIG. 12 is a flow chart of operations of the apparatus of FIG. 10(A) and 10(B);

FIG. 16 is flow chart of operations of the apparatus of FIG. 14, explaining the operation shown in FIGS. 15(A) through 15(D);

FIG. 34 shows a configuration of a circuit board trimming apparatus of a twelfth embodiment of the present invention;

DESCRIPTION OF THE PREFERRED EMBODIMENTS

Figure 10A:
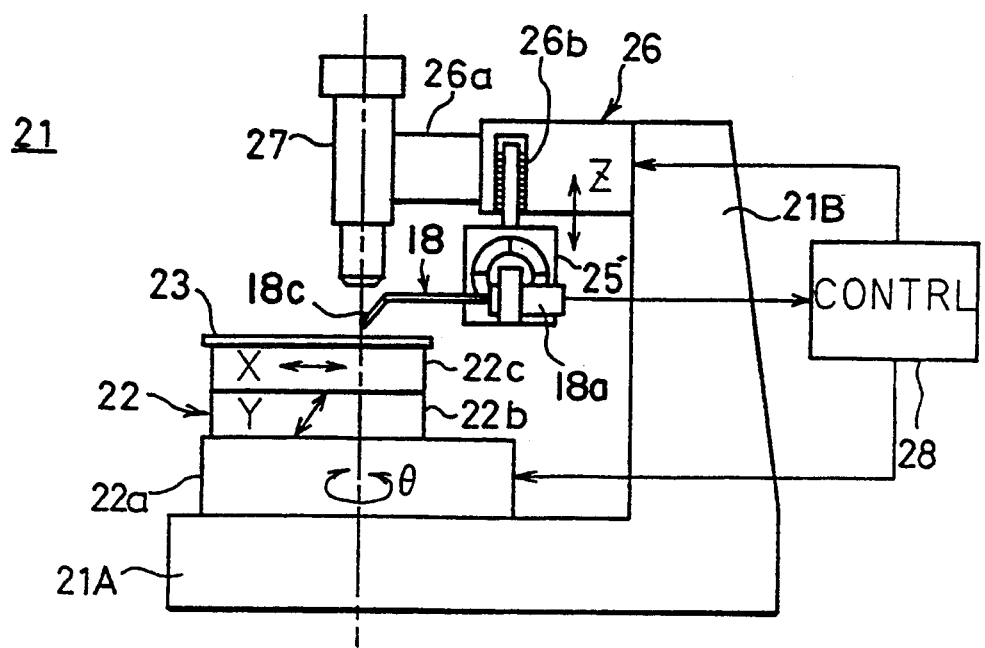
FIGS. 10(A) and 10(B) show a configuration of a circuit board trimming apparatus of a first embodiment of the present invention.
Figure 10B:
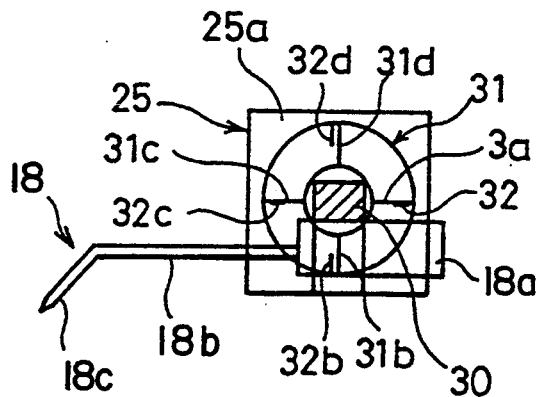

FIGS. 10(A) and 10(B) show a configuration of a circuit board trimming apparatus 21 of a first embodiment of the present invention. Specifically, FIG. 10(A) shows the overall configuration and FIG. 10(B) shows a configuration of a force sensor used in the apparatus of FIG. 10(A).

Referring to FIG. 10(A), an apparatus 21 has a stage part 22 comprising: a rotating stage 22a provided on a base 21A and rotating on a central axis C; a moving stage 22b provided on the stage 22a and moving in a Y direction; and a moving stage 22c provided on the stage 22b and moving in a X direction, a printed circuit board 23 being supported on the uppermost stage 22c. The base 21A has a substantially vertical pillar 21B, and an arm part 26 extends laterally from the pillar 21B. An arm 26a extends from an end of the arm part 26, and a microscope 27 is attached to the end of the arm 26a so as to be aligned with the central axis C.

A vertical moving mechanism 26b is provided on the arm part 26, and a cutter 18 is attached to the vertical moving mechanism 26b via a force detecting mechanism 25 such that the cutter is vertically (in a Z direction) movable. An ultrasonic oscillation unit 18a is assembled to the cutter 18 and provides a cutting edge 18c with an ultrasonic energy via an oscillation transmitting part 18b. As in the case of the apparatus of FIG. 6, the ultrasonic oscillation is provided so as to induce a longitudinal oscillation of the cutter 18. A wiring pattern to be trimmed is removed by applying the cutting edge 18c to the wiring pattern on the circuit board 23 and by moving the circuit board 23 in a longitudinal direction of the cutter 18, i.e. in the direction that the ultrasonic oscillation is applied. Typically, an ultrasonic oscillation of a 60 kHz frequency is applied by the ultrasonic oscillation unit 18a to the cutting edge 18c, the tip of the cutting edge oscillating at an amplitude of $\pm 2$–5 $\mu$m.

A driving mechanism (not shown in the figure) for moving the circuit board 23 is provided on the stages 22a–22c. The rotating stage 22a is used to align the direction that the wiring pattern on the circuit board is cut and the aforementioned moving direction of the circuit board 23. The cutter 18 is driven to be moved up and down with respect to the circuit board 23 by means of the vertical moving mechanism 26b. A controlling unit 28 is provided in order to drive the stages 22a–22c and the vertical moving mechanism 26b. While FIG. 10(A) shows as if the stages 22a–22c were driven as one for simplified illustration, each of the stages 22a–22c is driven independently. Typically, the stage 22a is made to rotate on the axis C over a stroke of 90° with a 0.1° precision. The stages 22b and 22c are movable in the X direction and in the Y direction over a range of 300 mm with a precision of 1 $\mu$m.

In the circuit board trimming apparatus of this embodiment, the ultrasonic cutter 18 is assembled to the vertical moving mechanism 26b via the force detecting mechanism 25, and the force detecting mechanism 25 detects a force operating between the circuit board 23 and the cutting edge 18c of the cutter 18. The force detecting mechanism 25 generates an output signal corresponding to the force thus detected and applies the signal to the controlling unit 28. It is thus possible, in the apparatus of FIG. 10(A), to control a feed in the three directions (the X direction, the Y direction and the Z direction), in correspondence to the force exerted on the cutting edge 18c of the cutter 18, and to effect an optimal control of the feed in correspondence to the shape of the pattern to be trimmed.

FIG. 10(B) shows an example of the force detecting mechanism 25 used in the apparatus of FIG. 10(A). Referring to FIG. 10(B), the force detecting mechanism 25 comprises: a base 30 to which the cutter 18 is assembled; and blade springs 31a–31d for suspending the base 30 in a frame 25a of the force detecting mechanism 25, the blade springs 31a–31d forming a crossed spring suspension mechanism. Each of the blade springs 31a–31d is provided with a strain gauge 32, and thus the force detecting mechanism 25 operates as a torque sensor for detecting a torque applied to the cutter 18. The force detecting mechanism 25 is capable of detecting a force on the cutting edge 18c with a precision of 0.1 gf.

The configuration of the force detecting mechanism 25 is not limited to the one shown in FIG. 10(B), but can also be the ones shown in FIG. 11(A) or FIG. 11(B).

In the apparatus shown in FIG. 11(A), the force detecting mechanism 25 is provided on an elevator 26b' assembled on the base 21A so as to measure the weight of the cutter 18 and an ultrasonic oscillation unit 18a. In the apparatus shown in FIG. 11(B), the force detecting mechanism 25 is constructed of a coil spring so as to measure a torque applied to the cutter 18. Of these variations, the configuration of FIG. 11(A) is susceptible to vibration conveyed from the floor via the mass of the cutter 18. Therefore, the torque sensors of FIG. 10(B) and FIG. 11(B) are considered more suitable as the force detecting mechanism 25 because these two configurations are less susceptible to the effect of the mass than the configuration of FIG. 11(A). The use of a torque sensor prevents a translational movement such as vibration from the floor from affecting the output of the detecting mechanism, and only the force applied to the cutting edge of the cutter is output as the torque. The output torque is converted to a force by means of the controlling unit 28.

FIG. 12 explains an example where a defective wiring pattern on the circuit board 23 is trimmed by using the circuit board trimming apparatus of FIG. 10(A).

Referring to FIG. 12, in a step ST1, the position of a defective wiring pattern on the circuit board 23 is confirmed by means of the microscope 27, whereupon the stages 22a–22c are moved so that the cutting edge 18c of the cutter 18 is aligned with the position of the defective pattern. For example, the stages 22b and 22c are moved in the X direction and in the Y direction so that the position of the defective pattern and the position of the cutting edge 18c are aligned, whereupon the stage 22a is rotated so that the direction that the defective pattern is cut is aligned with the direction of ultrasonic oscillation. Then, in a step ST2, the cutter 18 is lowered toward the circuit board 23 by driving the vertical moving mechanism 26b under the control of the controlling unit 28. In a step ST3, the controlling unit 28 monitors the output of the force detecting mechanism 25 and, when it is determined that the cutting edge 18c contacts the defective wiring pattern on the circuit board 23, a next step ST4 is carried out. In the step ST4, the controlling unit 28 allows the cutter 18 to be further lowered by means of the vertical moving mechanism 26b while monitoring the output of the force detecting mechanism 25. The controlling unit 28 can allow the cutter 18 to be lowered, by a specified amount, beyond a point where the cutting edge 18c contacts the pattern.

In a step ST5, the ultrasonic oscillation unit 18a is operated. In a step ST6, the defective wiring pattern is removed as the stage part 22 is moved by a specified direction aligned with the direction that the ultrasonic oscillation is applied. Typically, the stage part 22, i.e. the circuit board 23, is fed at a speed of about 100 $\mu$m/sec.

In a step ST7 following the step ST6, the ultrasonic oscillation unit 18a is turned off. In a step ST8, the controlling unit 28 removes the cutter 18 from the circuit board 23 by driving the vertical moving mechanism 26b upward. Further, in a step ST9, a determination is made as to whether or not a trimming operation is required in another location. If the answer is YES, the process returns to the step ST1 and the cutting operation is repeated. It is also possible to repeat the trimming operation on the same location. In such a case, it is ensured in the step ST8 that the cutter 18 is raised by about 0.1 mm so as not to collide with the surface of the circuit board 23 due to a warp on the circuit board.

The process explained in FIG. 12 ensures, once the contact between the cutting edge 18c and the circuit board is detected, that the force exerted on the cutting edge 18c is maintained at a regular level even under a variation of the relative position of the cutting edge 18c with respect to the circuit board, the variation being due to warp or irregularity on the circuit board. It is thus possible to trim the defective wiring pattern in such a manner that damage to the circuit board 23 is minimized.

Figure 13A:
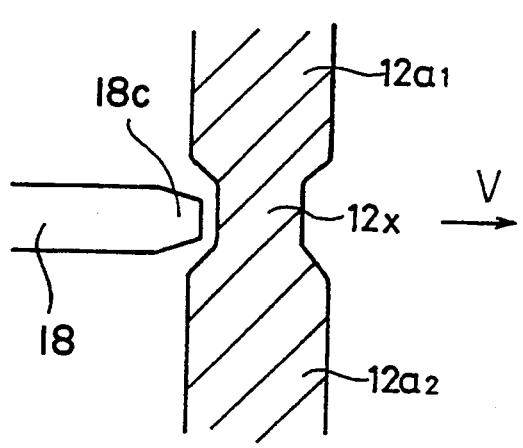
FIGS. 13(A) through 13(D) explain a cutting operation according to the flow chart of FIG. 12.
Figure 13B:
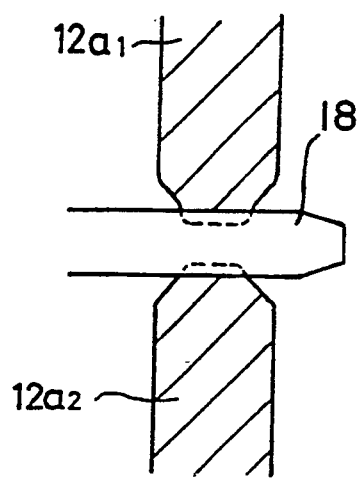

FIGS. 13(A)–13(B) show how the above-described process is applied to a case where two wiring patterns $12a_1$ and $12a_2$ are short-circuited by the defect $12x$.

Figure 13C:
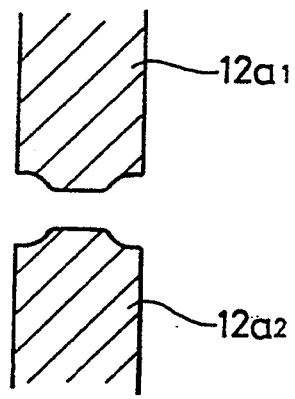
Figure 13D:
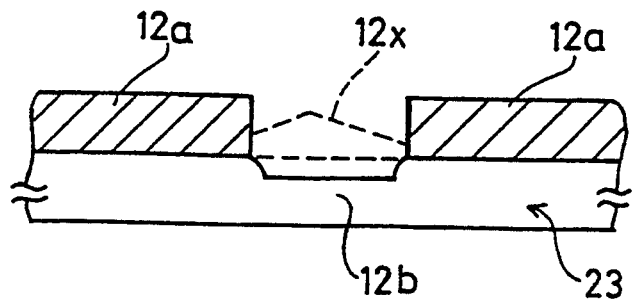

Referring to FIG. 13(A), in a step ST1, the cutting edge 18c and the defective pattern $12x$ to be trimmed are aligned by moving the stages 22b and 22c in the X direction and in the Y direction, whereupon the stage 22a is rotated so that the direction that the ultrasonic oscillation is applied to the cutting edge 18c and the direction in which the defective part $12x$ is cut are aligned. In steps ST2–ST5, the cutting edge 18c is brought into contact with the defective pattern $12x$ and is applied the ultrasonic oscillation. In a step ST6, the pattern $12x$ is cut out as shown in FIG. 13(C), by feeding the stage part in the direction V aligned with the direction that the ultrasonic oscillation is applied, whereby the pattern $12a_1$ and the pattern $12a_2$ are detached from each other. As a result of this, the defective pattern $12x$ is removed and a part of the insulating area $12b$ in the circuit board is scraped off so as to form a groove having a regular depth, as shown in FIG. 13(D).

Figure 14:
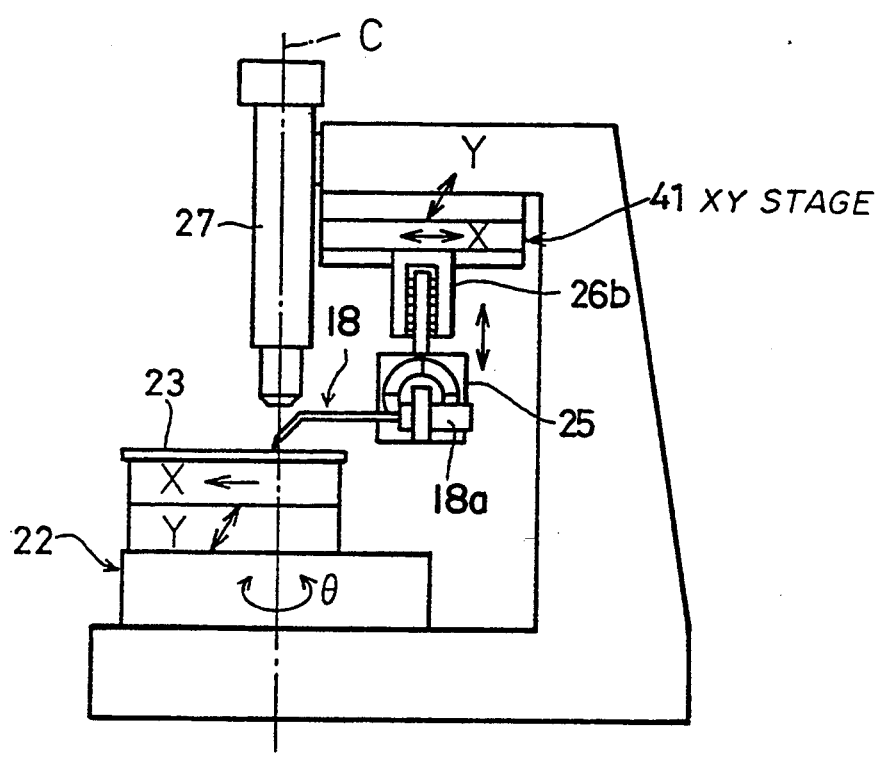
FIG. 14 shows a variation of the apparatus of FIGS. 10(A) and 10(B)

FIG. 14 shows an apparatus which is a variation of the apparatus of FIG. 10(A). The apparatus shown in FIG. 14 is provided with a stage 41 for moving the vertical moving mechanism 26b in the X direction and in the Y direction. It is possible, in such a setup, to effectively remove the defective part $12x$ shown in FIGS. 15(A) and 15(B) and having an arc-like contour, by displacing the cutting edge 18c of the cutter 18 with respect to the axis C.

Figure 15A:
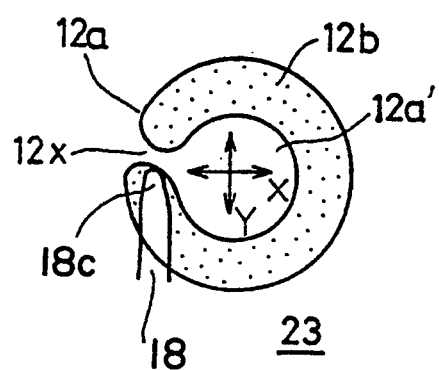
FIGS. 15(A) through 15(D) show how a circuit board is trimmed by using the apparatus of FIG. 14.
Figure 15B:
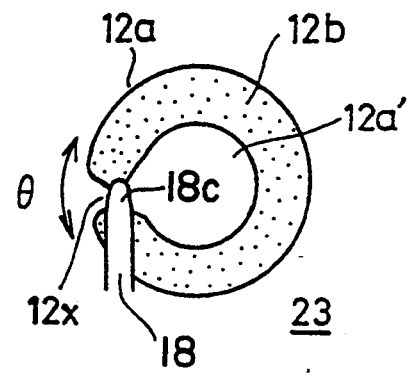
Figure 15C:
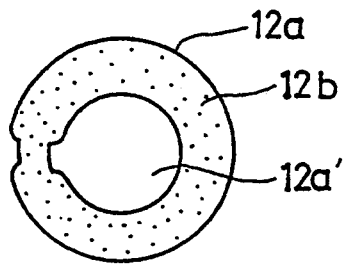
Figure 15D:
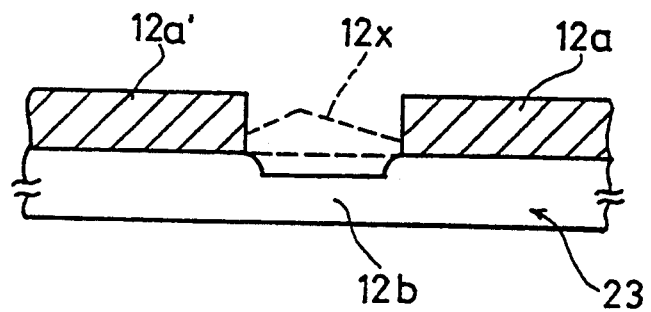

FIG. 16 is a flow chart of operations of cutting out the defective pattern $12x$ shown in FIGS. 15(A) and 15(B), by employing the apparatus of FIG. 14. In FIG. 16, those steps corresponding to the steps of FIG. 12 are given the same reference numerals and the description thereof is omitted.

Referring to FIG. 16, in a step ST1A, the stage 22a is driven so that the direction that the defective pattern on the circuit board is cut is aligned with the direction that the ultrasonic cutter 18 is applied. In a step ST1B, the stages 22b and 22c are driven so that the center of the arc outlining the defective part to be removed resides on the axis C. In a step ST1C, the stage 41 is driven so as to move the cutting edge 18c to the position of the arc of the part to be removed. Those steps corresponding to the steps ST2 through ST5 of FIG. 12 are carried out, after which, in a step ST6', the stage 22a is driven so as to carry out a cutting operation in which the defective pattern having a arc-like contour is removed. The other features of the steps of FIG. 16 are identical to those of FIG. 12 and the description thereof is omitted.

Figure 17:
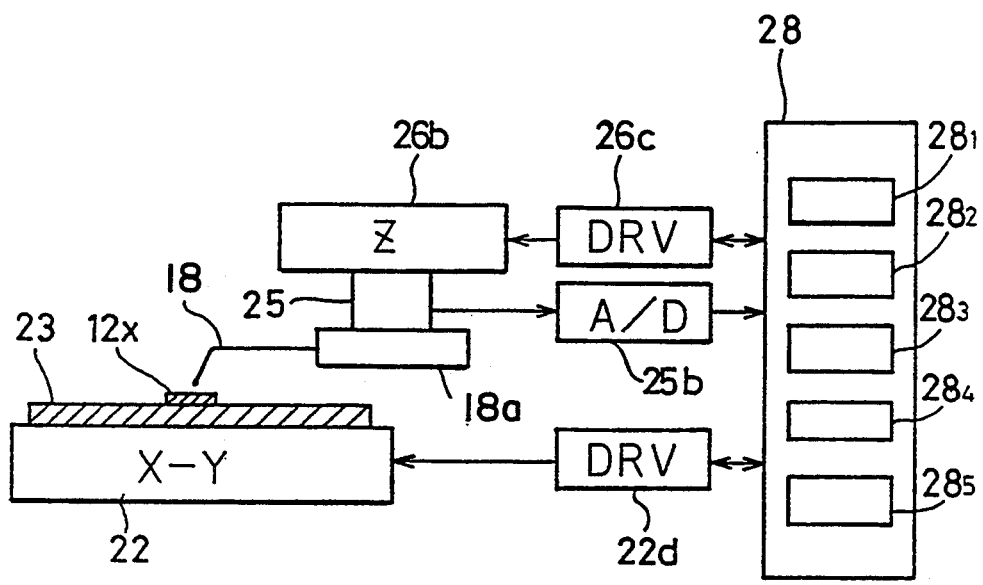
FIG. 17 shows a configuration of a circuit board trimming apparatus of a second embodiment of the present invention.

FIG. 17 shows a schematic configuration of a wiring pattern trimming apparatus used in a second embodiment of the present invention. FIG. 17 corresponds to the apparatus of FIG. 10(A). Therefore, those parts that have corresponding parts in FIG. 10(A) are given the same reference numerals from figure to figure, and the description thereof is omitted.

Referring to FIG. 17, the controlling unit 28 has a contact detecting part $28_1$ constructed by hardware or software means; the contact detecting part $28_1$ is fed with an output signal output from the force detecting mechanism 25 and then converted to a digital signal through an A/D converter 25b, and detects a contact between the cutting edge 18c and the circuit board 23, by detecting the variation of the output signal. The controlling unit 28 comprises: a target setting part $28_2$ which, by being fed an actual Z coordinate of the cutter 18 by the vertical moving mechanism 26b, sets a target-Z-coordinate; a comparing part $28_3$ which, by being fed the target Z coordinate and the actual Z coordinate, compares the two coordinates; a correcting part $28_4$ which corrects the target-Z-coordinate on the basis of a comparison result obtained in the comparing part $28_3$; and a spring constant computing part $28_5$ for obtaining a spring constant of a block comprising the horn 18b, the cutting edge 18c and the force detecting mechanism 25.

A description will now be given, with reference to a flow chart of FIG. 18, of operations of the circuit board trimming apparatus of this embodiment.

Figure 18:
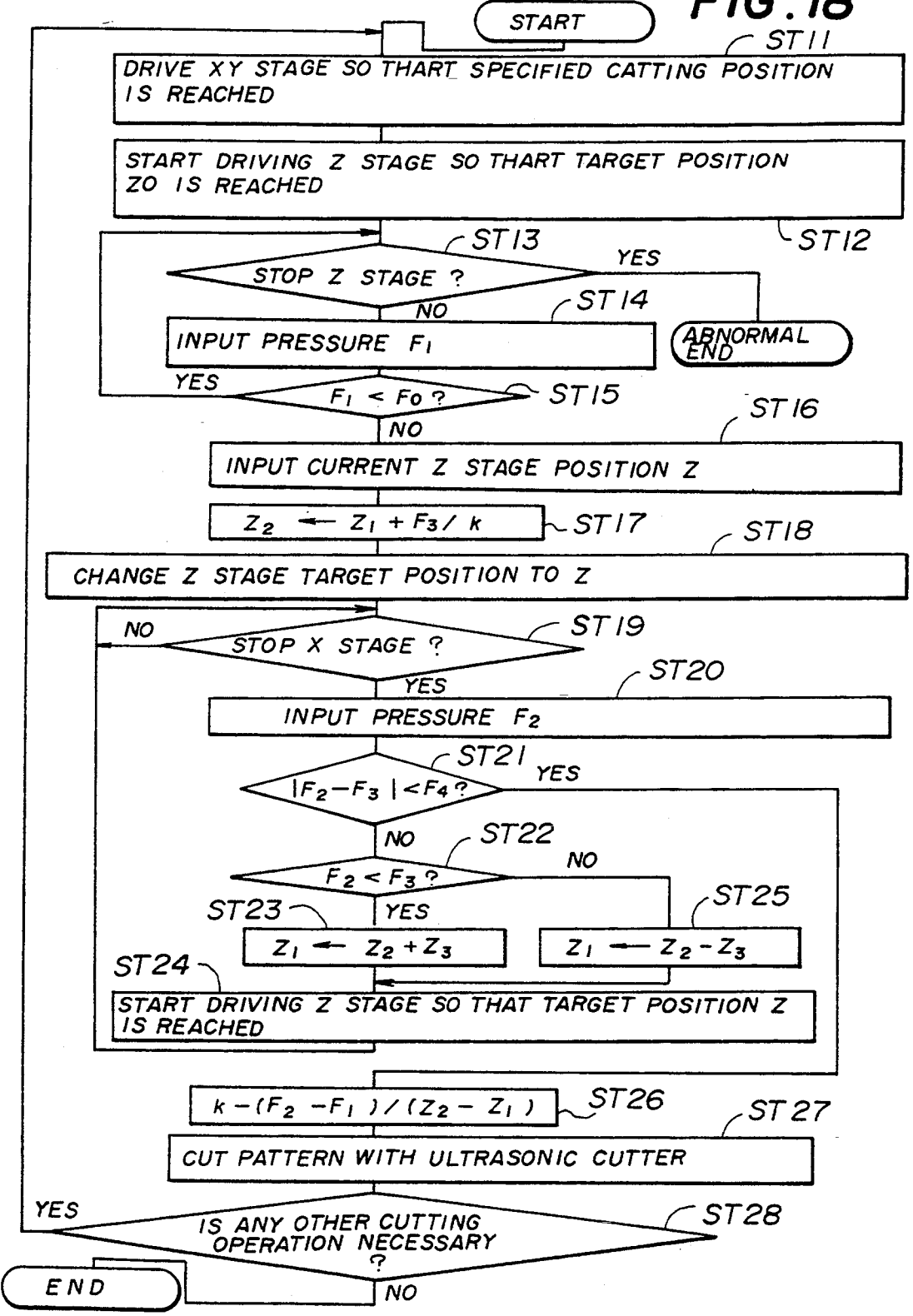
FIG. 18 is a flow chart of operations of the apparatus of FIG. 17.

Referring to FIG. 18, in a step ST11 corresponding to the step ST1 of FIG. 12, the stage part 22 is moved so that the defective pattern to be removed from the circuit board is aligned with the cutting position of the cutter 18. In a subsequent step ST12, the vertical moving mechanism 26b is driven so as to lower the cutter 18. While the step ST12 corresponds to the step ST2 of FIG. 12, the step ST12 is unique in that the target setting part $28_2$ sets the target-Z-coordinate $Z_0$ in correspondence to the initial position of the cutter 18 and in that the vertical moving mechanism 26b is driven at a rapid rate until the target coordinate $Z_0$ is reached In a step ST13, a determination is made as to whether or not the vertical moving mechanism 26b is continuing its lowering motion; if its motion is halted, a flag indicating an abnormal operation is generated and the operation is abnormally ended. If it is found that the lowering motion of the cutter 18 is continuing, a force $F_1$ applied to the cutting edge 18c is monitored in a step ST14. In a step ST15, a determination is made as to whether or not the force $F_1$ is smaller than a specified level $F_0$. If the answer is YES in the step ST15, it is determined that the cutter 18 is not in contact with the circuit board 23 or with the defective pattern 12x thereon, and the loop consisting of the steps ST13–ST15 is repeated. If it is determined in the step ST15 that the force $F_1$ is greater than the specified level $F_0$, the current Z coordinate, $Z_1$, of the cutter 18 is obtained in a step ST16. In a step 17, a target-Z-coordinate $Z_2$ of the cutter 18 is obtained, on the basis of the Z coordinate $Z_1$ of the cutter 18 and on the basis of a target force $F_3$, as per $$Z_2 = Z_1 + F_3/k$$

When the target-Z-coordinate $Z_2$ is obtained in the step ST17, the lowering of the cutter 18 is begun in a step ST18 with the target coordinate $Z_2$ is reached.

After the lowering of the cutter 18 is begun in the step ST18, a determination is then made in a step ST19 as to whether or not the lowering motion is continuing. The step ST19 is repeated until the cutter reaches the target coordinate $Z_2$ and stops. When the cutter 18 reaches the target coordinate $Z_2$, a current force $F_2$ is obtained in a step ST20. In a step ST21, a determination is made as to whether or not the absolute value of the difference between the force $F_2$ and the force $F_3$ is smaller than a specified tolerable level $F_4$. If the difference is smaller than the permissible level, the lowering motion is stopped. If it is found in the step ST21 that the absolute value of the difference between the force $F_2$ and the force $F_3$ is greater than the permissible level $F_4$, a determination is then made in a next step ST22 as to whether or not the force $F_2$ is smaller than the force $F_3$. When it is found that the force $F_2$ is smaller than the force $F_3$, the lowering motion of the cutter 18 is insufficient. Therefore, in a step ST23, the target-Z-coordinate $Z_2$ is incremented by a specified minute amount $Z_3$. The steps ST19–ST23 are repeated so as to further lower the cutter 18 until the renewed target-Z-coordinate $Z_2$ is reached. When it is determined in the step ST22 that the force $F_2$ is greater than the target force $F_3$, a step ST25 is carried out, and the target-Z-coordinate $Z_2$ is renewed by being decremented by a specified minute amount $Z_3$, whereupon, in the step ST24, the cutter is raised so that the renewed target-Z-coordinate $Z_2$ may be reached.

When the cutter 18 is positioned at a Z coordinate at which the desired force $F_3$ is obtained, a step ST26 is carried out where a spring constant k is renewed, on the basis of the coordinates $Z_1$ and $Z_2$, and on the basis of the respective forces $F_1$ and $F_2$, as per $$k = (F_2 - F_1)/(Z_2 - Z_1),$$

and a cutting operation is carried out in a step ST27. In a step ST28, a determination is made as to whether or not there is any other defective part to be trimmed. When the answer is NO, the trimming operation is terminated. If YES, the process returns to the step ST11. While it is true that a spring constant of the cutting edge 18c need not be updated as long as the condition thereof remains unchanged, the spring constant k above is determined by the overall spring constant of the force detecting mechanism 25, the horn 18b, the cutting edge 18c, the vertical moving mechanism 26b and the arm 26, and it is difficult to determine an exact value of the spring constant k beforehand. Inclusion of the step ST27, in which the spring constant is updated, in the process ensures that an exact value of the spring constant k of the whole apparatus of FIG. 10(A) is obtained; i.e. an approximate spring constant value given in the step ST17 is updated by bringing the cutter 18 in contact with the circuit board 23 and by varying the force between the cutter and the board.

The method of the present invention has an advantage that a desired force can be reached more readily than in the method where the cutter is lowered at a constant rate until a desired force is reached. When the cutter is lowered at a constant rate until a desired force is obtained, an overshoot of the cutter may be caused unless the lowering speed is reduced before the cutter comes to a halt. Repetitive steps are therefore required in which the cutter is raised for a time to be lowered again later. In the controlling method of this embodiment, only a minimum amount of time is required for the force to reach a desired level because the lowering of the cutter is controlled in accordance with the target Z coordinate, and the target-Z-coordinate is updated in accordance with the force detected by the force detecting mechanism 25. As in the case of the embodiment of FIG. 12, the embodiment of FIG. 18 has an advantage that the positioning of the cutter can be efficiently carried out even when there is warp on the circuit board or when the defective pattern(s) to be trimmed have (has) an irregular height. Further, it is possible, by controlling, as explained in FIG. 18, the position of the cutter in accordance with the target position, to effect more stable lowering operation of the cutter than when the Z coordinate of the cutter is controlled in accordance with the output of the force detecting mechanism 25 only. When the Z coordinate of the cutter 18 is controlled in accordance with the output of the force detecting mechanism 25 only, the operation of the vertical moving mechanism 26b tends to become unstable because, when the cutting edge is not in contact with the circuit board, the output of the force detecting mechanism 25 is zero. Because this embodiment is free from such instability of operation, it is not necessary to include such special elements as filters and dead zones in the controlling unit 28.

Figure 19:
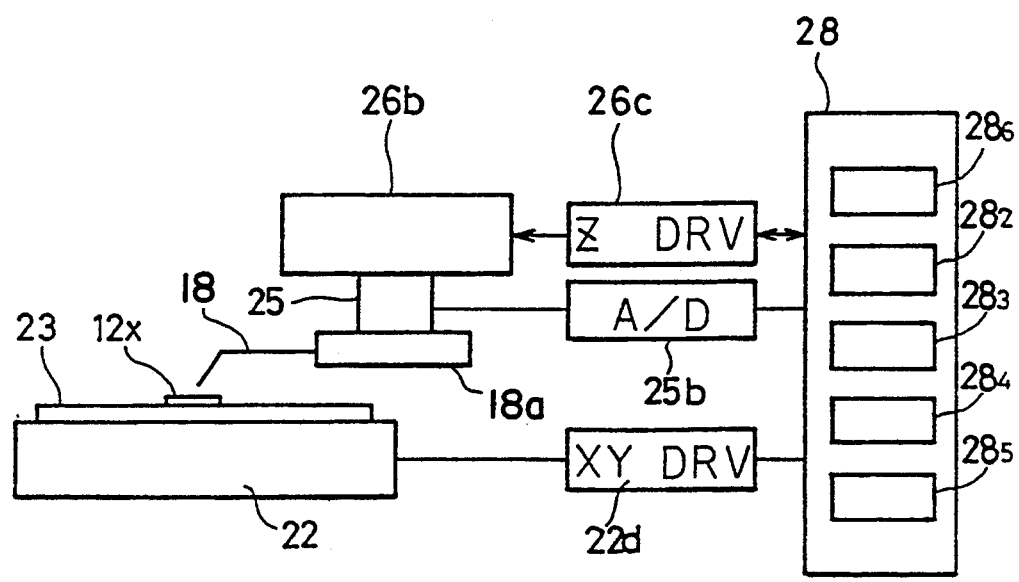
FIG. 19 is a configuration of a circuit board trimming apparatus of a third embodiment of the present invention.

FIG. 19 shows a schematic configuration of the circuit board trimming apparatus of the third embodiment of the present invention.

Referring to FIG. 19, this circuit board trimming apparatus has an almost identical configuration 1 as that of the apparatus of FIG. 17 except that the contact detecting part $28_1$ for detecting the contact of the cutter 18 with the circuit board 23 is replaced by a deceleration-start-determining part $28_6$ for determining the start of deceleration of the lowering speed of the cutter 18.

Figure 20:
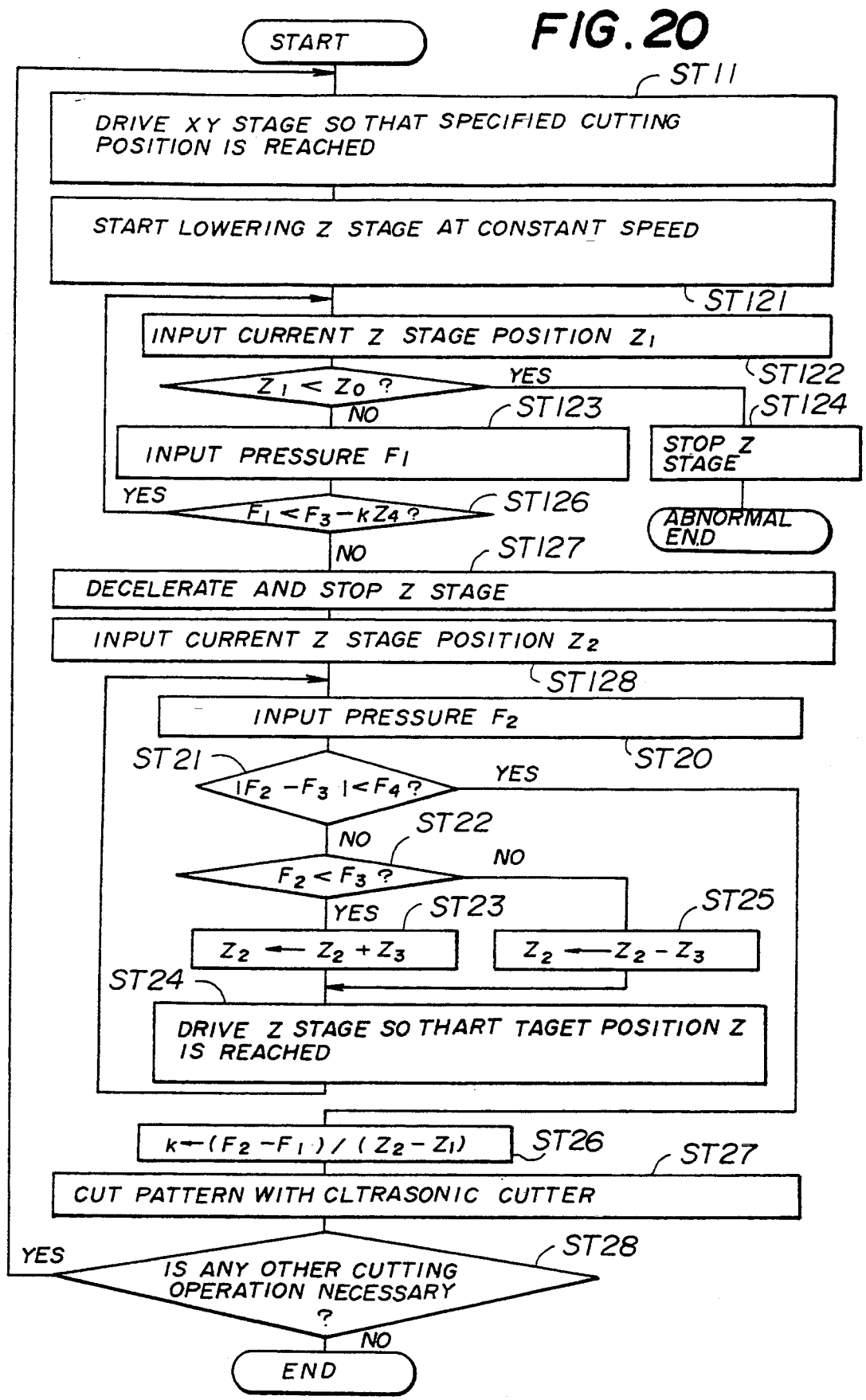
FIG. 20 is a flow chart of operations of the apparatus of FIG. 19.

FIG. 20 is a flow chart for explaining operations of the apparatus of FIG. 19, and those steps corresponding to the steps of FIG. 18 are given the same reference numerals from figure to figure.

Referring to FIG. 20, the defective pattern 12x on the circuit board 23 is properly positioned with respect to the cutter 18 in a step ST11. In a step ST12 following this, the vertical moving mechanism 26b is driven at a constant rate so that the cutter begins to be lowered at a specified rate. In a step ST122, the Z coordinate $Z_1$ of the vertical moving mechanism 26b is determined; in a step ST123, a determination is made as to whether or not the Z coordinate $Z_1$ has exceeded a specified abnormality detection position $Z_0$. When it is determined that the abnormality detection position $Z_0$ has been exceeded, i.e. the answer is YES, a step ST124 is carried out in which the vertical moving mechanism 26b is stopped, and the operation is terminated after a flag indicating an abnormality is generated.

If an answer NO results in a determination in the step ST123, the force $F_1$ exerted on the cutter 18 is determined in a step ST125. In a step ST126, a determination is made as to whether or not the force $F_1$ is smaller than a threshold value $F_3-kZ_4$ at which deceleration is to be begun. $Z_4$ indicates an amount of lowering operation required from the start of deceleration till the cutter 18 comes to a stop. An amount $kZ_4$ indicates an increment of the force accrued from the moment that the deceleration started till the moment when the cutter 18 came to a halt. When it is determined in the step ST126 that the detected force $F_1$ is smaller than the value obtained by subtracting the increment $kZ_4$ from the desired force $F_3$, the lowering amount of the cutter 18 is insufficient, and the vertical moving mechanism 26b continues to be driven by repeating the steps ST122 through ST126.

When it is determined in the step ST126 that the force $F_1$ is greater than the force $F_3-kZ_4$, a step 127 is carried out so as to decelerate the vertical moving mechanism 26b. In a step ST128, the current Z coordinate $Z_2$ is detected, whereupon the subsequent steps including the step ST20 are carried out as explained by referring to FIG. 18.

According to this embodiment, an efficient circuit board trimming operation is possible because the lowering of the cutter is decelerated immediately after the cutting edge 18c of the cutter 18 is in contact with the circuit board 23, after which the force of the cutter is optimized through steps similar to the ones in the embodiment of FIG. 18. Of the steps shown in FIG. 20, the steps ST121–ST128 correspond to the operation of the deceleration start determining part $28_6$.

Figure 21:
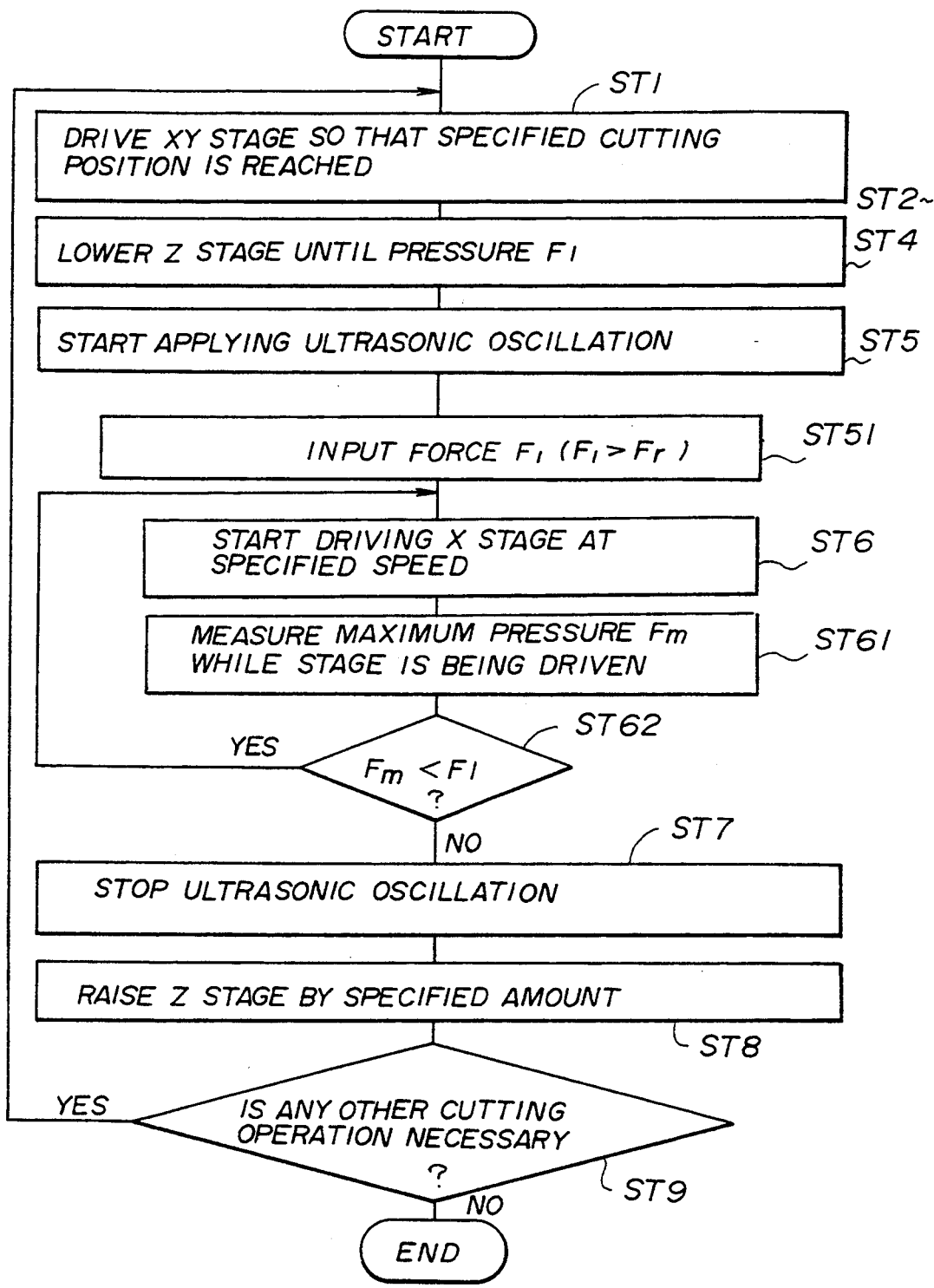
FIG. 21 is a flow chart of circuit board trimming operations of a fourth embodiment of the present invention.

A description will now be given, with reference to FIG. 21, of a fourth embodiment of the present invention. In FIG. 21, those steps corresponding to the steps described heretofore are given the same reference numerals from figure to figure, and the description thereof is omitted.

Referring to FIG. 21, in the step ST1, the defective pattern on the circuit board 23 is aligned with the cutter 18. The vertical moving mechanism 26b is driven in the steps ST2 through ST4 so that the cutter 18 is lowered toward the circuit board 23. The cutter 18 is not yet applied an ultrasonic oscillation, and the force of the cutter is controlled to be a force Fr, which is smaller than the desired force $F_1$ by 0.1–0.2 gf. This is because the force is greater when an ultrasonic oscillation is applied while the cutter 18 is in contact with circuit board than when it is not applied.

An ultrasonic oscillation is applied to the cutter 18 in the step ST5, and, in a step ST51, the force $F_1$ is input. As has been described earlier, the force $F_1$ is slightly greater than the force Fr. In the step ST6, stage 22b or 22c is driven so that the circuit board is fed in a specified direction and the defective pattern is trimmed; for example, it is fed once in the X direction. Typically, the circuit board 23 is fed at a rate of about 100 μm/sec. After the step ST6 is started, the force F exerted on the cutting edge 18c of the cutter 18 is measured in a step ST61. A maximum value $F_m$ during one feeding operation is determined. In a step ST62, a determination is made as to whether the force Fm is greater than the specified value $F_1$. When it is found that Fm is greater than $F_1$, the steps ST6–ST62 are repeated. That is, the variation of the maximum force value Fm is monitored as the circuit board undergoes repeated cutting operations; when Fm is below the specified value $F_1$, it is determined that the desired trimming operation is finished. Thereafter, the ultrasonic oscillation is turned off in the step ST7. Of course, the value of Fm becomes smaller as a cutting operation is repeated.

After the ultrasonic oscillation is turned off in the step ST7, a determination is made in the step ST9 as to whether or not there is any other defective pattern to be trimmed. If there is, the steps including and following the step ST1 are repeated.

Figure 22A:
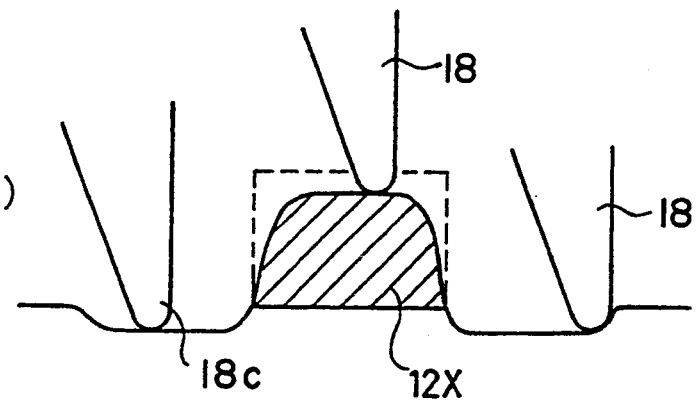
FIGS. 22(A) through 22(C) show a circuit board trimming process according to the flow chart of FIG. 21.
Figure 22B:
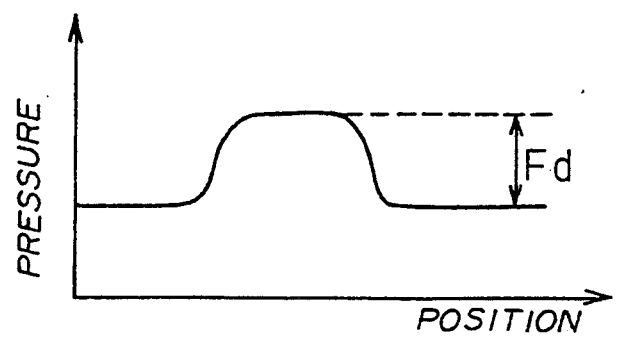
Figure 22C:
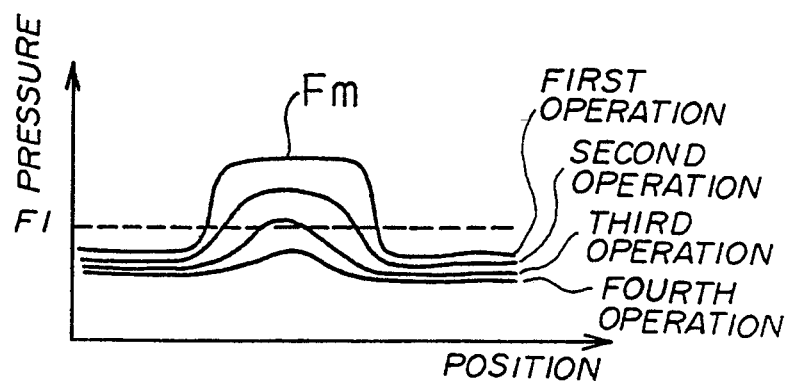

FIGS. 22(A)–22(C) show how the defective pattern 12x is removed according to the steps of FIG. 21.

Referring to FIG. 22(A), one cutting operation using the cutter 18 applied on the defective pattern 12x having a rectangular cross-section results in the pattern having a cross-section indicated by the cross-hatching, the force exerted on the cutting edge 18c of the cutter 18 varying as shown in FIG. 22(B). The variation of the force when such a cutting operation is repeated is shown in FIG. 22(C). In this example, it is found that the maximum force value Fm becomes smaller than the specified value $F_1$ after four cutting operations. That is, in the illustrated example, it is determined that the trimming of the pattern is completed after four cutting operations.

By using the method of this embodiment, it is possible to effect a trimming operation in such a manner that no part of the defective pattern remains unremoved irrespective of an irregular shape of a defective pattern and that damage to the circuit board is minimized, because the variation of the force is monitored and circuit board trimming operations are repeated on the basis of monitored results.

A description will be given now, with reference to FIGS. 23(A)–23(C), of a circuit board trimming method in which damage to the circuit board is minimized.

Figure 23:
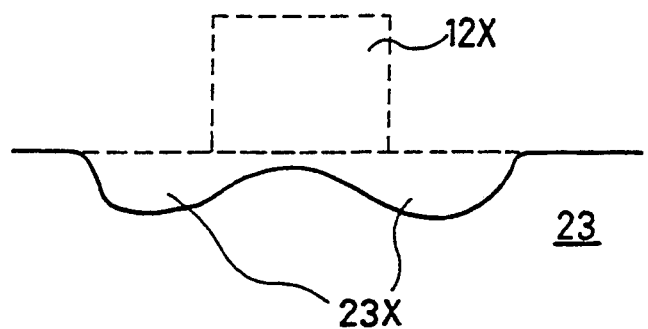
FIG. 23(A) through 23(C) show a circuit board trimming process of a fifth embodiment of the present invention.
Figure 23:
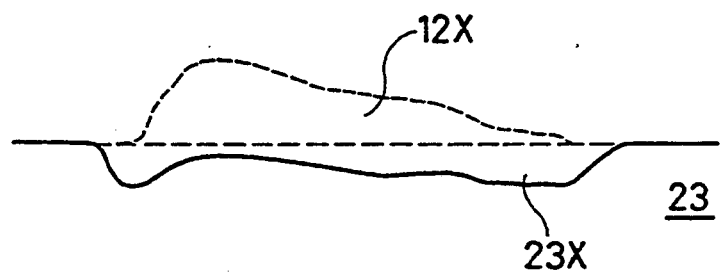

FIG. 23(A) shows a case where the steps of FIG. 21 are applied to the defective pattern 12x having a rectangular shape as shown in FIG. 22(A). FIG. 23(B) the steps of FIG. 21 are applied to the defective pattern 12x having an irregular shape. It can be seen from FIGS. 23(A) and 23(B) that there is a tendency that a damaged part 23x of the circuit board 23 is not deep where the thickness of the defective pattern is greater and that the damage part 23x is deep where the defective pattern is thinner or in the periphery of the defective pattern.

In this embodiment, the variation of the shape of the defective pattern is monitored on the basis of the distribution of the force obtained in the step ST61 of FIG. 21, so that an excessive cutting operation causing a damage to the circuit board may not be carried out. Referring to FIG. 23(C), when the force of the cutter 18 exceeds the specified value $F_1$ over a spatial range extending from a position $Xs_1$ to a position $Xe_1$ after a first cutting operation, a second cutting operation is carried out only over the range between the position $Xs_1$ and the position $Xe_1$. When the force of the cutter 18 exceeds the specified value $F_1$ over a spatial range between a position $Xs_2$ and a position $Xe_2$ as a result of the second cutting operation, a third cutting operation is carried out only over the range between the position $Xs_2$ and the position $Xe_2$. When the force exceeds the force $F_1$ over a range between a point $Xs_3$ and a point $Xe_3$, a fourth cutting operation is carried out only over the range between the position $Xs_3$ and the position $Xe_3$.

Figure 23C:
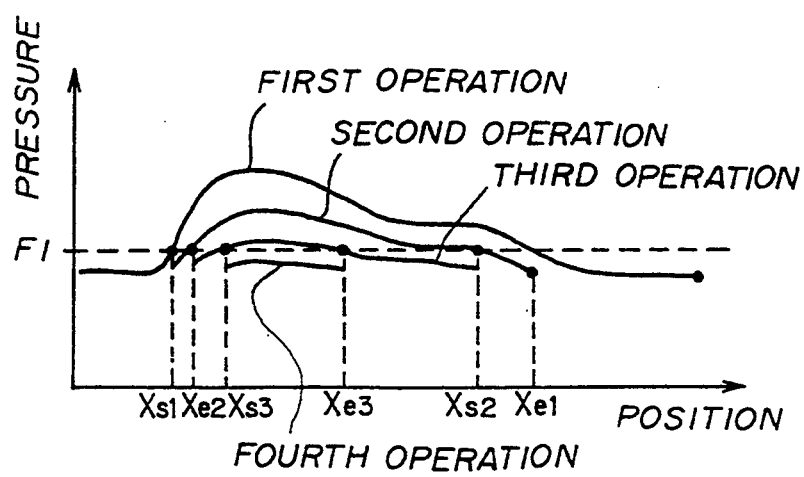
Figure 24:
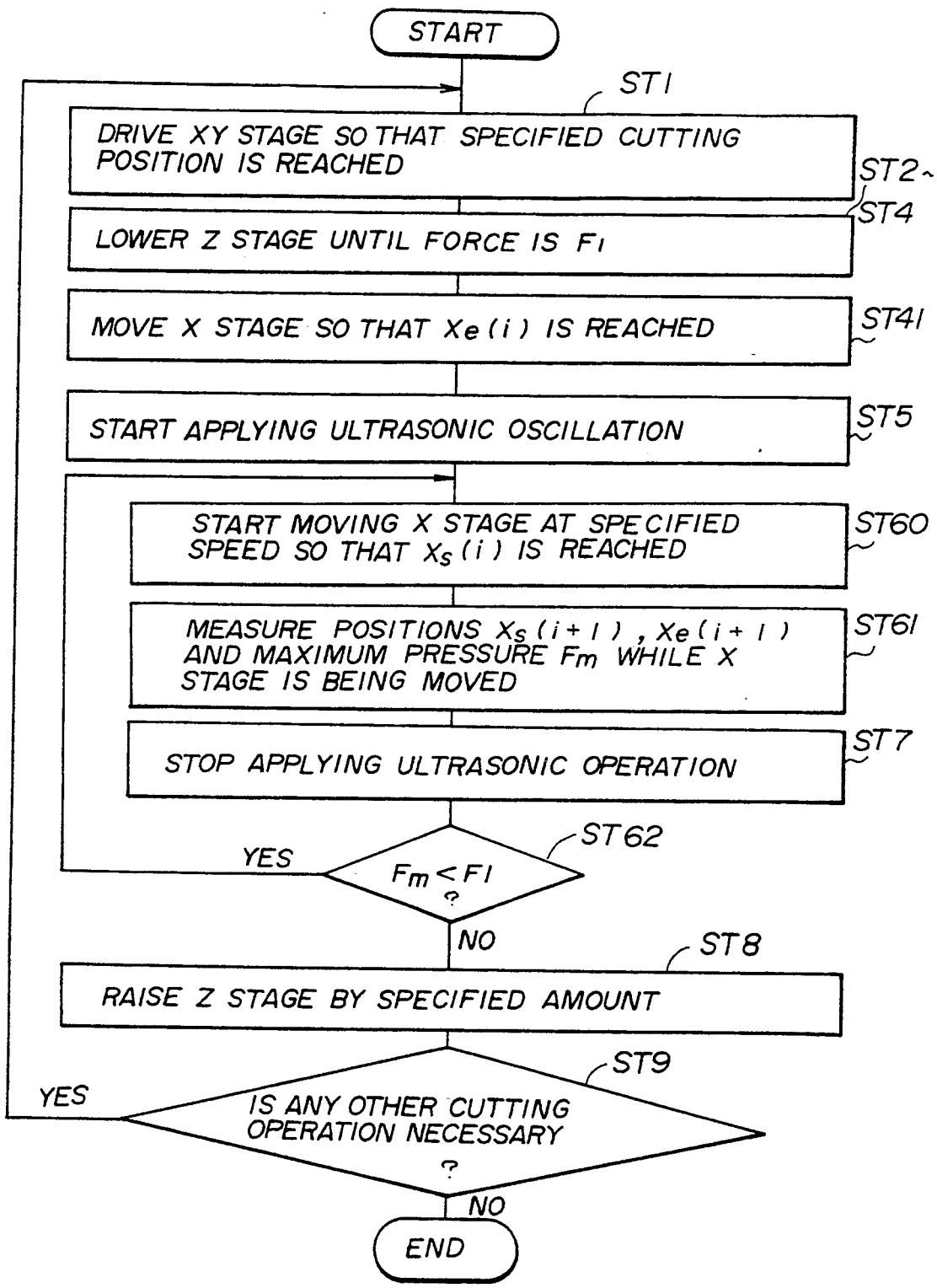
FIG. 24 is a flow chart corresponding to the process of FIGS. 23(A) through 23(C)

FIG. 24 is a flow chart showing steps for carrying out the operations of FIG. 23(C). Referring to FIG. 24, those steps that have been described heretofore are given the same reference numerals from figure to figure, and the description thereof is omitted.

Referring to FIG. 24, in the step ST1, the defective pattern 12x on the circuit board 23 is aligned with the cutter 18. In the steps ST2 through ST4, the vertical moving mechanism 26b is driven so as to lower the cutter 18 until the force thereof reaches the specified value Fr. In a step ST41, the stage part 22, for example the stage 22c, is moved in the X direction as far as a position Xe(1). In the step ST5, an ultrasonic oscillation is applied. In a step ST60, the stage 22c is moved in the X direction as far as a position Xs(1) and a cutting operation is carried out. As the stage is moved in the step ST60, the maximum force Fm exerted on the cutting edge 18c of the cutter 18 is measured in a step ST61, while at the same time positions Xs(2) and Xe(2), where the force is equal to the specified force $F_1$, are determined. In the step ST7, the application of ultrasonic oscillation is terminated. In a step ST62, a determination is made as to whether the force Fm is greater or smaller than the force $F_1$. When the force Fm is greater than the force $F_1$, the process returns to the step ST41, in which step the stage 22c is moved as far as the position Xe(2).

A second cutting operation is carried out in the steps ST5 and ST60, after which next positions Xe(3) and Xs(3) are determined in the step ST61. When the force Fm is smaller than the force $F_1$, the step ST8 is carried out so as to raise the cutter by a specified amount. When it is found in the step ST9 that there is another defective pattern to be trimmed, the steps including and following the step ST1 are carried out again.

A description will now be given, with reference to a flow chart of FIG. 25 explaining a sixth embodiment of the present invention, of a method of cutting a pattern having a large area and not allowing accurate detection of the shape of the pattern, such as a power source pattern layer or a grounding pattern layer. The methods of FIGS. 21 and 24 for finding out the shape on the basis of the force can not be employed with such uniform patterns because there is no reference height.

In this embodiment, the surface of the pattern is designated as the reference surface, and a cutting operation is repeated until an amount by which the surface is cut out exceeds the thickness of the pattern. The spring constant k of the cutter 18 is determined, and the cutting amount is determined on the basis of the decrease of the force as a cutting operation is repeated. Since the force decreases as the cutting process proceeds, the vertical moving mechanism 26b is driven as the cutting process proceeds so that a desired force is secured. A cutting force is determined as per $$C = Z_1 - Z_2 + (F_1 - F_2)/k$$

where $Z_1$ is a Z coordinate of the cutter 18 before the cutting process, $Z_2$ is a Z coordinate of the cutter 18 after the cutting process, $F_1$ is a force before the cutting process, and $F_2$ is a force after the cutting process.

Figure 25:
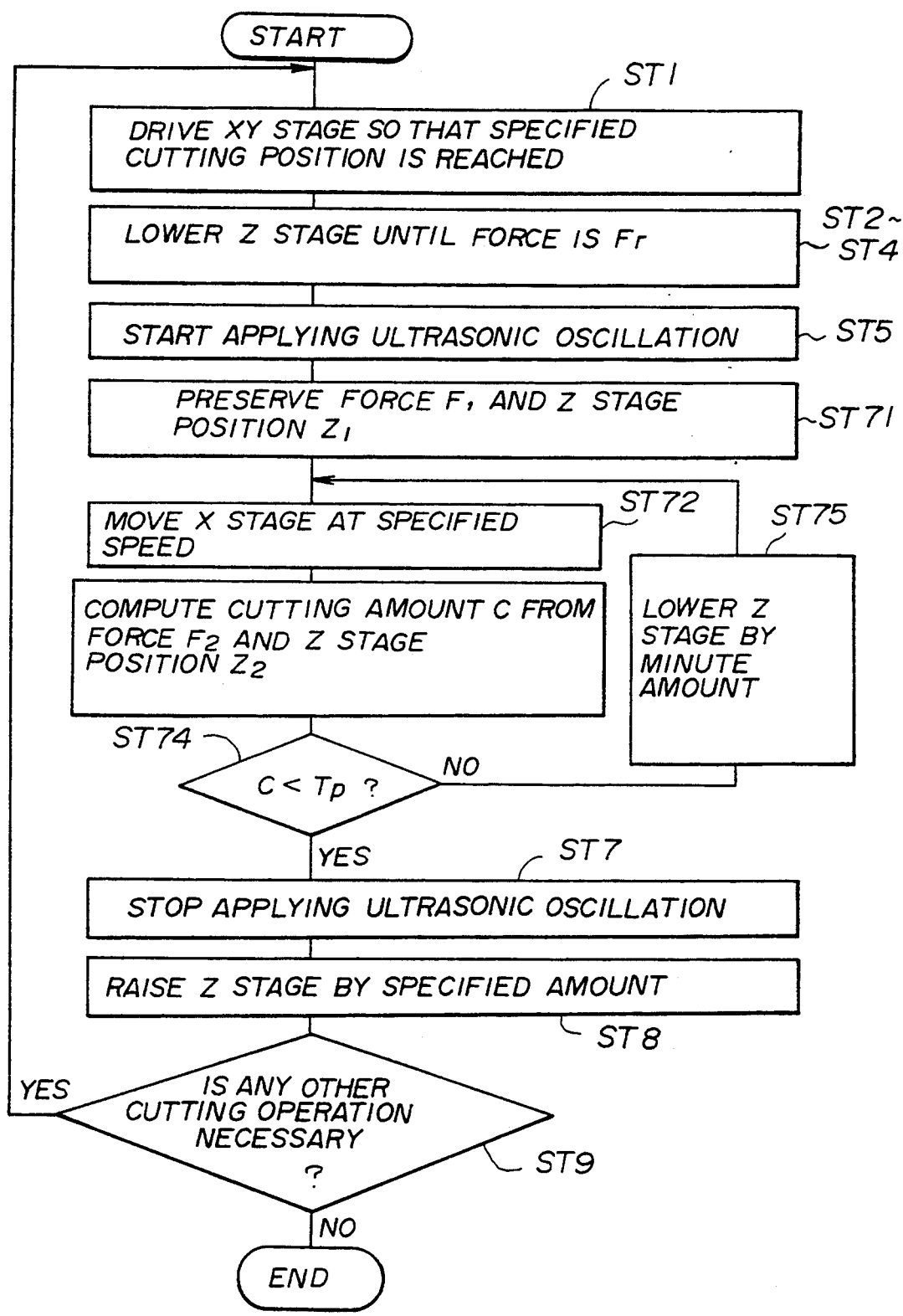
FIG. 25 is a flow chart of a circuit board trimming process of a sixth embodiment of the present invention.

Referring to FIG. 25, the steps ST1–ST4 are the same as they are in the process shown in FIG. 24. Subsequent to the step ST4, the step ST5 is carried out and an ultrasonic oscillation is applied to the cutter 18. In this embodiment, the desired force $F_1$ and the corresponding Z coordinate $Z_1$ are preserved in a step ST71. In a step ST72, a defective pattern is cut out by feeding the stage 22c in the X direction In a step ST73, the cutting amount C is determined through the above formula, on the basis of the force $F_2$ and the Z coordinate $Z_2$ of the cutter 18. In a step ST74, a determination is made as to whether or not the cutting amount C is smaller than a thickness $T_p$ of the pattern. If the answer NO results from the determination in the step ST74, the step ST75 is carried out where the vertical moving mechanism 26b is driven so as to lower the cutter 18 by a minute amount. Thereafter, the steps including and following the step 72 are carried out. When it is determined in the step ST74 that the cutting amount C is either equal to or greater than the thickness of the pattern, the step ST7 is carried out where the application of ultrasonic oscillation is turned off, and, in the step ST8, the cutter is raised by a specified amount. In the step ST9, a determination as to the presence of other patterns to be trimmed is made. If there is another pattern to be trimmed, the steps including and following the step ST1 are repeated.

The circuit board trimming apparatus equipped with the force detecting mechanism of the present invention is useful in trimming a pattern formed on slanted circuit board FIGS. 26(A)–(H) show a seventh embodiment of the present invention, in which embodiment the apparatus of the present invention is applied to the circuit board having a slanted surface.

Figure 26A:
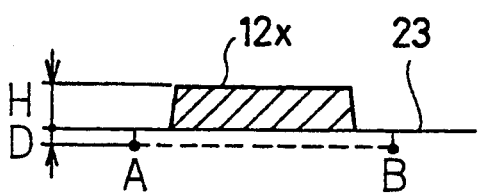
FIGS. 26(A) through 26(H) show a circuit board trimming process of a seventh embodiment of the present invention.
Figure 26B:
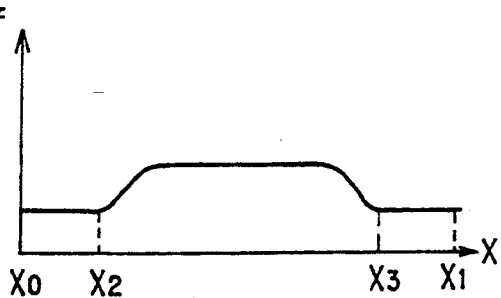

Referring to FIGS. 26(A)–26(G), FIGS. 26(A) and 26(B) show a case where the circuit board is flat and the steps of FIG. 24 are utilized in a modified manner. In this embodiment, the cutter 18 is applied to the circuit board 23 while an ultrasonic oscillation is not applied. The cutter 18 is then fed in a direction parallel to the circuit board, the distribution of the force being obtained as shown in FIG. 26(B). The force distribution as shown in FIG. 26(B) allows determining which part of the circuit board a defective pattern resides in, without cutting the circuit board. A cutting operation over a spatial range between a point $X_2$ and a point $X_3$ of FIG. 26(B) ensures that the defective pattern 12x is removed while damage to the circuit board is kept smaller than in any other embodiment heretofore described.

Figure 26C:
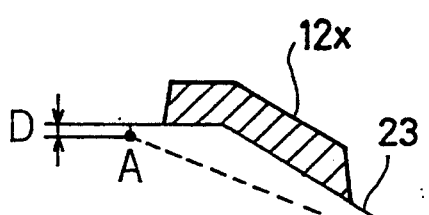
Figure 26D:
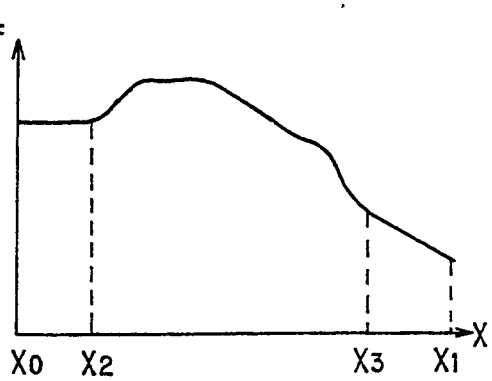
Figure 26E:
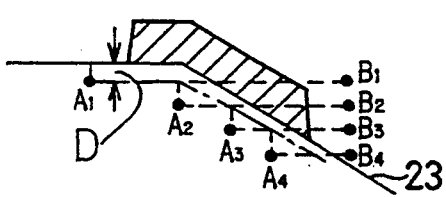

FIGS. 26(C)–26(E) show a case where the method of this embodiment is applied to the circuit board having a slanted surface. The cutter 18 is first applied to the defective pattern 12x as shown in FIG. 26(C) extending from a flat part into a slanted part, while ultrasonic energy is not applied, so that the force distribution as shown in FIG. 26(D) is obtained. Then an ultrasonic oscillation is applied to the cutter 18, which cutter is then run over a spatial range $x_2$–$x_3$ corresponding to a spatial range A–C according to the steps ST41–ST62 in the embodiment of FIG. 24. As a result, the pattern 12x is cut out over a range $A_1$–$B_1$ shown in FIG. 26(E), and is then cut out over a range $A_2$–$B_2$. It is also cut out in a range $A_3$–$B_3$ and then in a range $A_4$–$B_4$ Thus, the removal of the defective pattern along the shape of the circuit board is possible while damage to the circuit board 23 is minimized. In FIG. 26(E), the positions $B_1$, $B_2$, $B_3$ and $B_4$ all correspond to the position $x_3$ of FIG. 26(D). As can be seen from FIG. 26(E), a depth D of a circuit board damage is maintained substantially uniform in the circuit board trimming process of this embodiment.

Figure 26F:
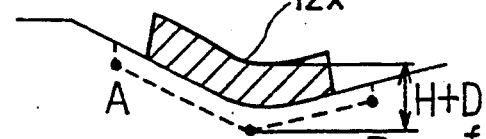
Figure 26G:
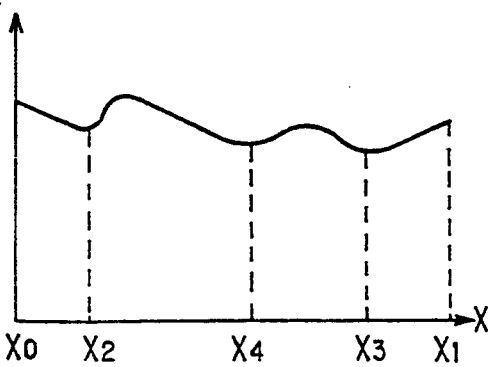
Figure 26H:
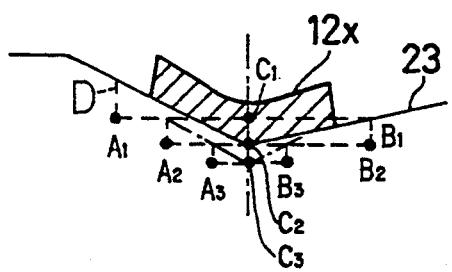

FIG. 26(F)–26(H) show a case where the defective pattern 12x is formed in a depression ABC on the circuit board. The cutter 18 is applied to the defective pattern 12x while ultrasonic energy is not applied. As shown in FIG. 26(G), the force distribution associated with the defective pattern is obtained for a range $x_2$–$x_3$ corresponding to a range AB of FIG. 26(F). A position C corresponds to the bottom of the depression. Then the steps ST41 through ST62 of FIG. 24 are carried out over the range AC and the range BC, whereby the defective pattern 12x is cut out by a specified depth D over a range $A_1$–$C_1$, as shown in FIG. 26(H). The pattern is further cut out by the specified depth D over a range $A_2$–$C_2$. In the illustrated example, the defective pattern 12x is further cut out by the specified depth D over a range $A_3$–$C_3$. The widths of the ranges $A_1B_1$, $A_2B_2$ and $A_3B_3$ are gradually smaller in the state order, as in the case of FIG. 26(E), so that the circuit board 23 is cut in a lateral direction to a substantially regular depth D and the left half of the defective pattern 12x is removed. A similar cutting operation is executed over the range BC and the right half of the defective pattern 12x is removed.

Figure 27:
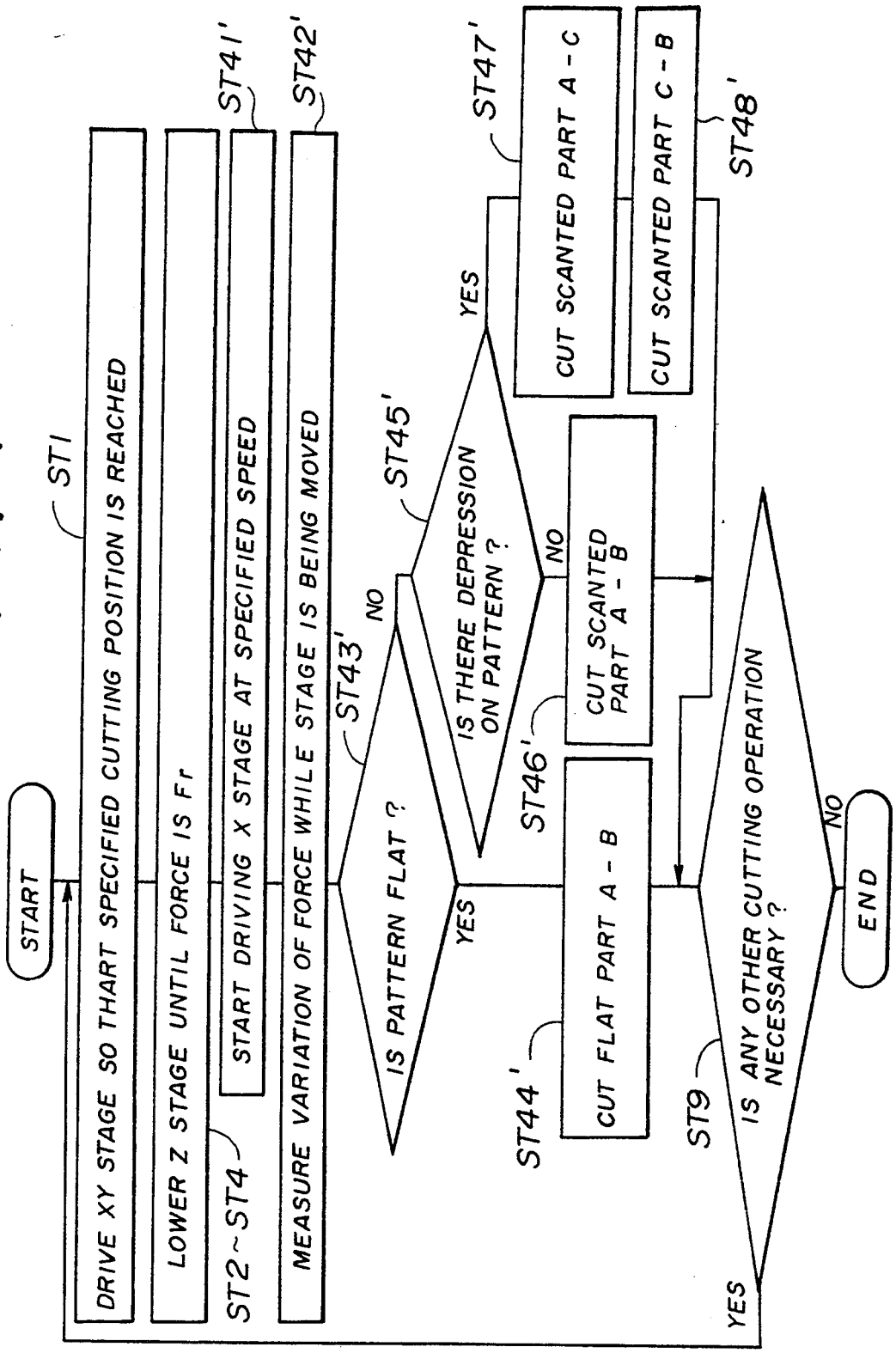
FIG. 27 is a flow chart corresponding to the process of FIGS. 26(A) through 26(H)

FIG. 27 is a flow chart for executing the circuit board trimming operations of FIG. 26(A)–26(H). In FIG. 27, those steps that have heretofore been described are given the same reference numerals from figure to figure, and the description thereof is omitted.

Referring to FIG. 27, after the cutter 18 is applied to the circuit board 23 with the force Fr by carrying out the steps ST1–ST4, the stage part is moved in a specified direction parallel to the circuit board surface, while ultrasonic energy is not applied to the cutter. In a step ST42' the variation of the force is measured In a step ST43' the shape of the defective pattern 12x is determined on the basis of the variation of the force. When the pattern 12x is flat as shown in FIG. 26(A) and 26(B), a step ST44' is carried out while ultrasonic energy is applied to the cutter 18. In the step ST44' the defective pattern is removed by repeating the steps ST41–ST62 of FIG. 24. When it is found in the step ST43' that the defective pattern 12x is not a flat pattern, a determination is made in the step ST42' as to whether the defective pattern 12x is formed on a slanted surface as shown in FIGS. 26(C)–26(E) or on a depression as shown in FIGS. 26(F)–26(H). When the pattern is formed on the slanted surface, the defective pattern is cut out and removed such that the steps ST41–ST62 of FIG. 24 are repeated over a range $A_1$–$B_1$, a range $A_2$–$B_2$, a range $A_3$–$B_3$ and a range $A_4$–$B_4$ as shown in FIG. 26(E), while ultrasonic energy is applied to the cutter 18. When the defective pattern 12x is formed in a depression, the depression is divided into two slanted surface. For each slanted surface, the steps ST41 through ST62 of FIG. 24 are executed as the steps ST47' and ST48'.

Figure 9A:
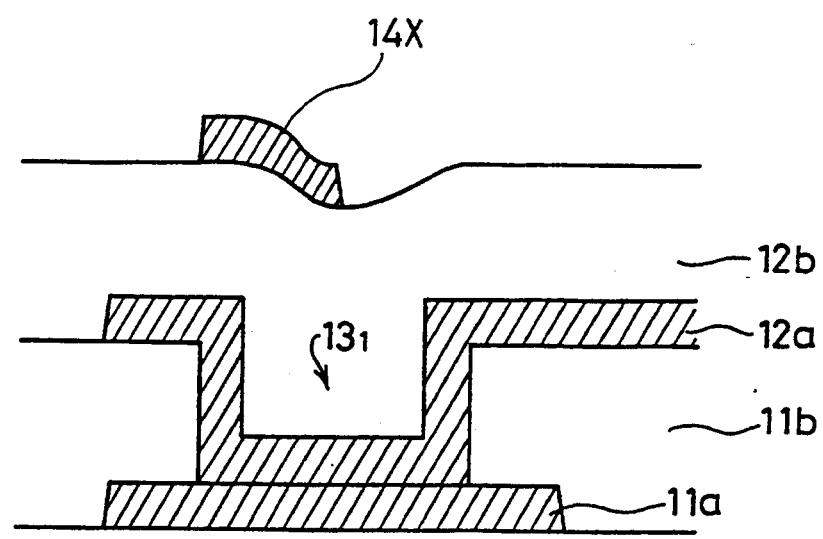
FIGS. 9(A) and 9(B) explain still another problem with the apparatus of FIG. 6.
Figure 9B:
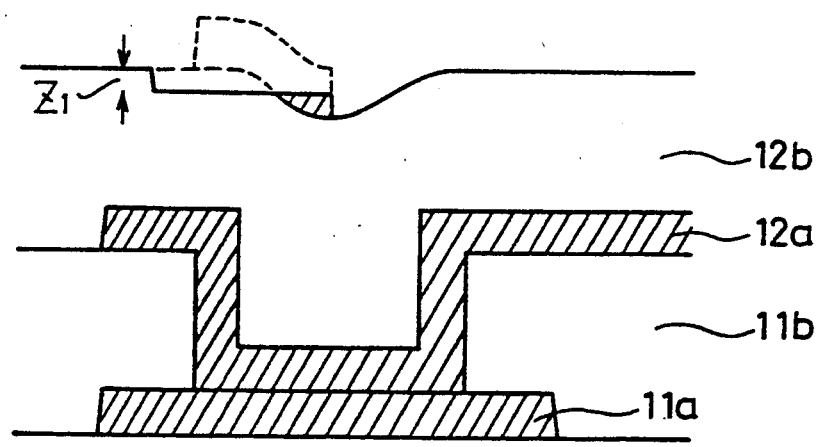

This embodiment solves conventional technical problems, such as the ones explained with reference to FIGS. 9(A) and 9(B), in such a manner that the shape of the defective pattern is determined on the basis of the variation of the force, by applying the cutter 18 to the pattern without ultrasonic energy applied to the cutter, and that a cutting operation is repeatedly executed in correspondence to the determined shape.

Figure 1:
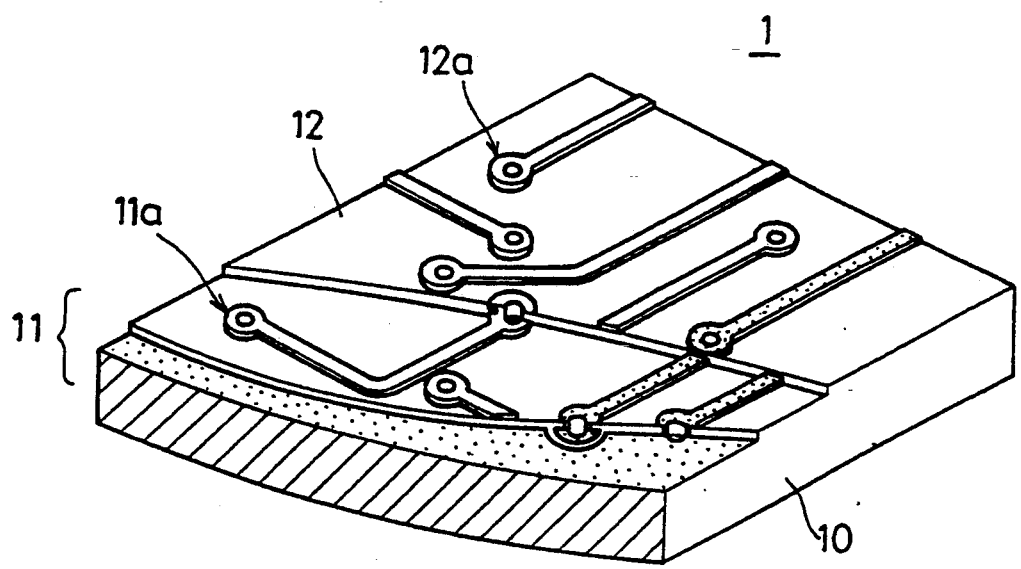
FIG. 1 shows an example of a printed circuit board in which the present invention is applied.
Figure 2A:
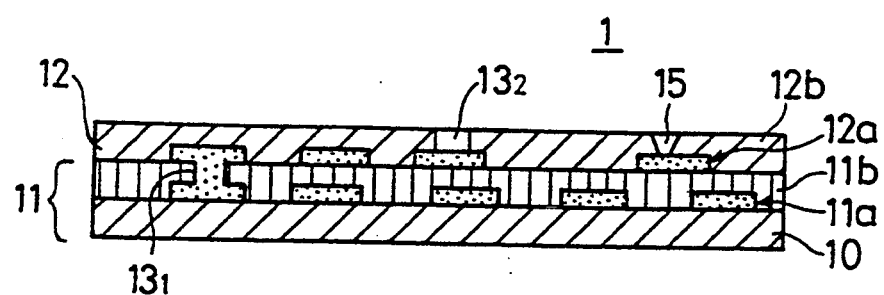
FIGS. 2(A) and 2(B) are cross-sections of an example of a conventional multi-layer circuit board.
Figure 2B:
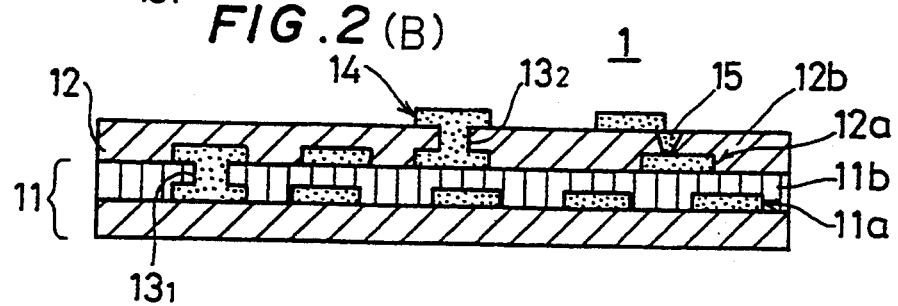
Figure 3A:
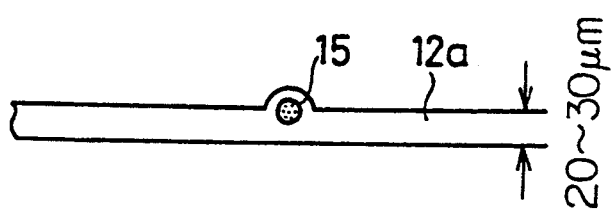
FIGS. 3(A) and 3(B) show how a defective pattern causing an intra-layer short circuit is trimmed.
Figure 3B:
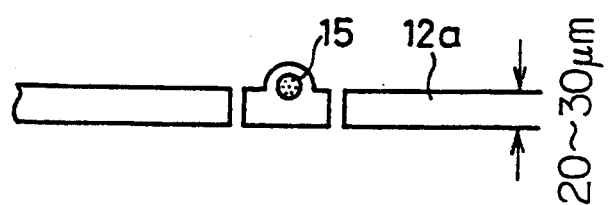
Figure 4A:
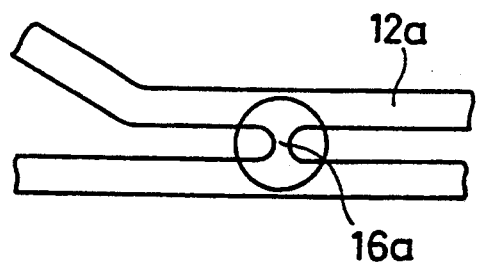
FIGS. 4(A) and 4(B) show how a defective pattern causing an intra-layer short circuit is trimmed.
Figure 4B:
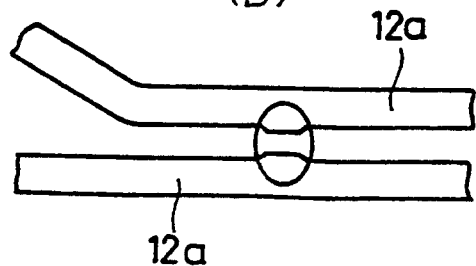
Figure 5:
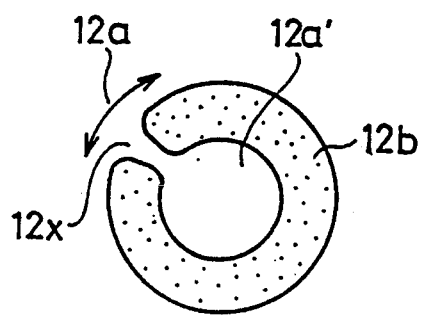
FIGS. 5(A) and 5(B) show how a defect in a pattern used in connecting layers is trimmed.
Figure 5:
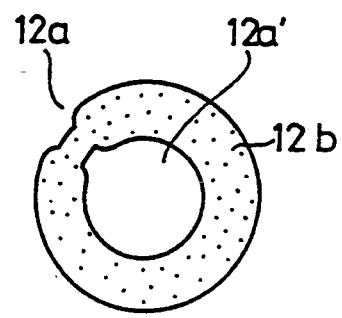
Figure 6:
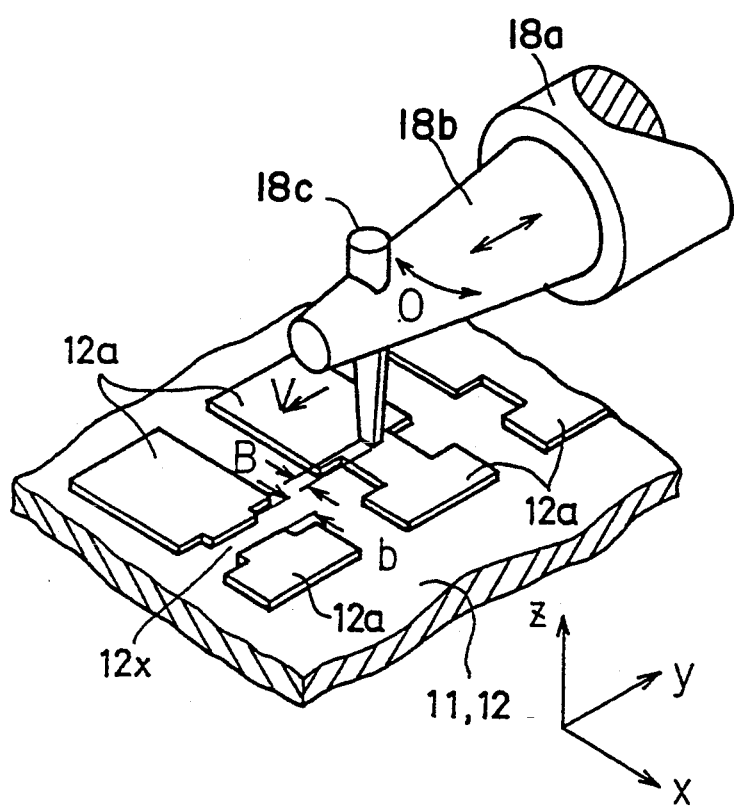
FIG. 6 shows a configuration of a conventional circuit board trimming apparatus using an ultrasonic cutter.
Figure 7A:
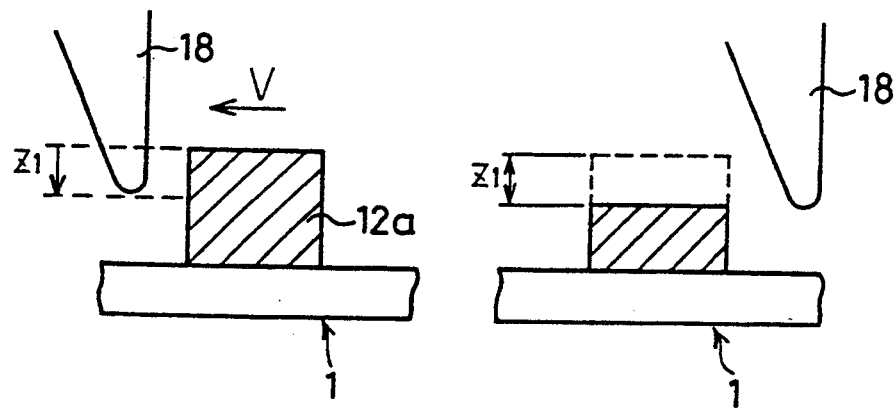
FIGS. 7(A) through 7(C) explain a problem arising when the apparatus of FIG. 6 is used.
Figure 7B:
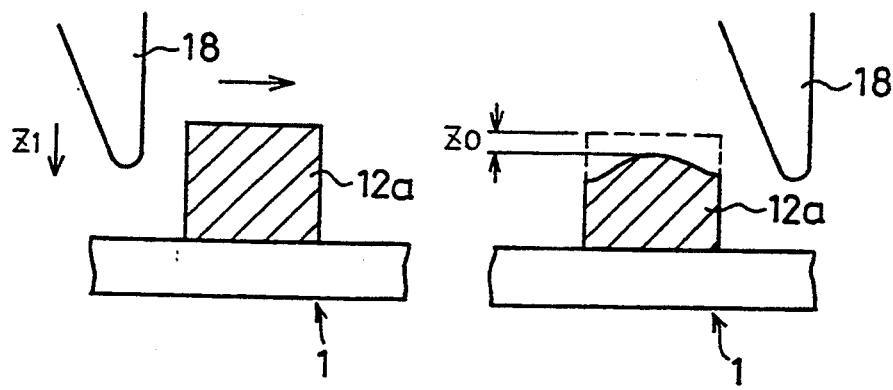
Figure 7C:
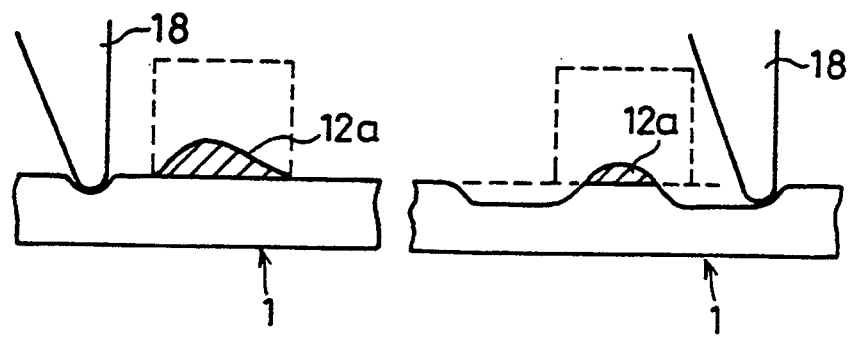
Figure 8A:
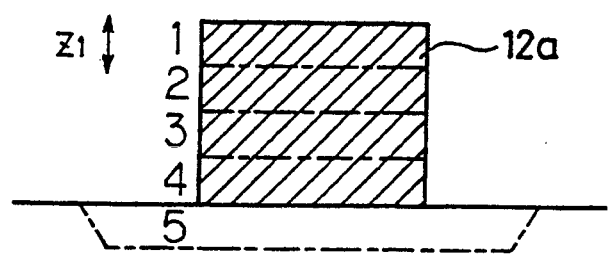
FIGS. 8(A) and 8(B) explain another problem arising when the apparatus of FIG. 6 is used.
Figure 8B:
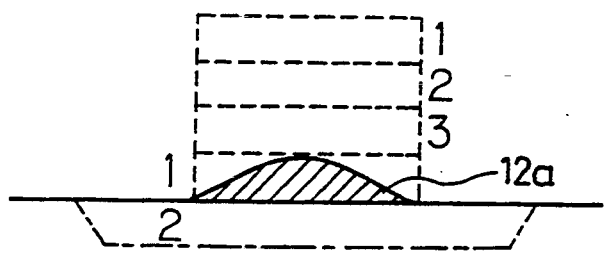

A description will now be given, with reference to FIGS. 28(A)–28(D), of an eighth embodiment of the present invention. In the conventional circuit board trimming apparatus employing an ultrasonic cutter, which apparatus is shown in FIG. 6, or in the circuit board trimming apparatus of the present invention, which apparatus is explained with reference to FIGS. 10(A) and 10(B), a burr may be created at the periphery when the defective pattern is cut. Such a burr may be as high as 10 $\mu$m, therefore possibly causing a short circuit between layers in a thin multi-layer circuit board. There is a problem that, while it is necessary, when a creation of burr is possible, to control a cutting amount for each cutting operation to be small, controlling a unit cutting amount to be small results in reduced throughput of the circuit board trimming operation. There is another problem that, when the peripheral part is cut out by means of an ultrasonic cutter in order to exclusively cut and remove the burr, the wiring pattern itself is cut out, whereby a burr is again created.

In the circuit board trimming apparatus of the present invention, which apparatus is shown in FIGS. 10(A) and 10(B), the force operating between the cutter 18 and the circuit board can be measured with the force detecting mechanism 25, so that, without causing any substantial damage to the wiring pattern, the burr can be exclusively removed after the defective pattern is cut, such a selective cutting operation being made possible by varying the force applied in correspondence to the wiring pattern to be cut.

FIGS. 28(A)–28(D) show how a burr is removed by means of the circuit board trimming apparatus of the first embodiment of the present invention, which apparatus is shown in FIGS. 10(A) and 10(B); FIG. 29 is a flow chart of operations of the apparatus.

Figure 28A:
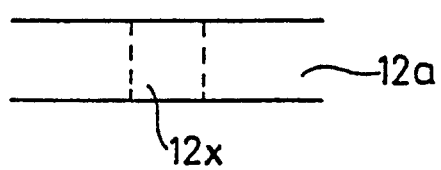
FIGS. 28(A) through 28(D) show a circuit board trimming process of an eighth embodiment of the present invention.
Figure 29:
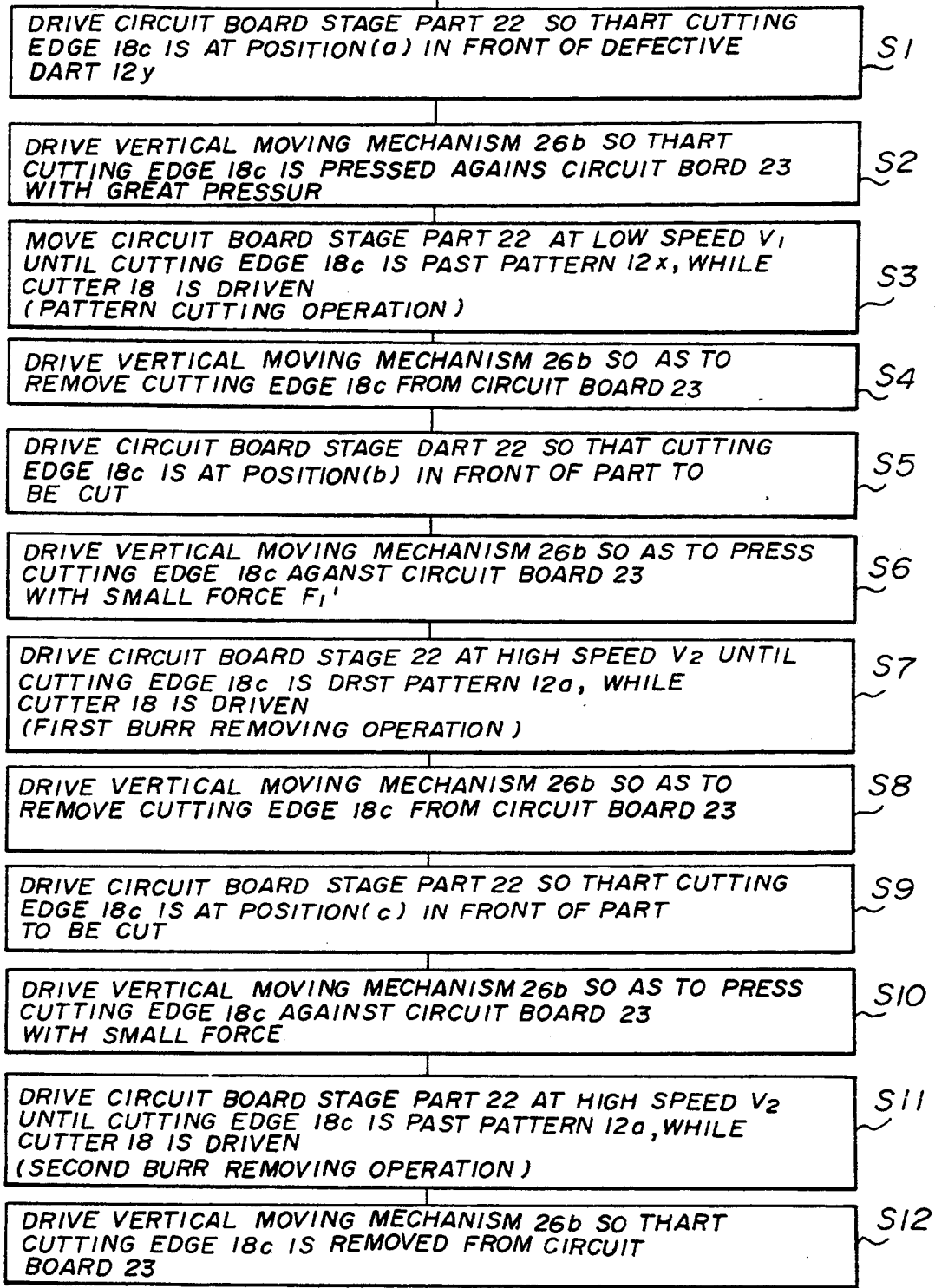
FIG. 29 is a flow chart corresponding to the process of FIGS. 28(A) through 28(D)

Referring to FIG. 29, the stage part 22 is moved in a step S1 so that the cutting edge 18c of the cutter 18 resides at a position (a) in front of the defective pattern 12x shown in FIG. 28(A). In a step S2, the vertical moving mechanism 26b is moved so that the cutting edge 18c contacts the circuit board 23 with a first force $F_1$ Further, in a step S3, ultrasonic energy is applied to the cutter 18, the stage part 22 is driven so that the circuit board 23 is moved with respect to the cutting edge 18c at a first speed $V_1$, and the defective pattern 12x is cut and removed. When the defective pattern 12x is removed, the vertical moving mechanism 26b is driven in a step S4 so that the cutting edge 18c of the cutter 18 is removed from the circuit board 23. As a result of such a cutting process, a burr 12y is created in a part adjacent to the defective pattern 12x in the wiring pattern 12a.

Figure 28B:
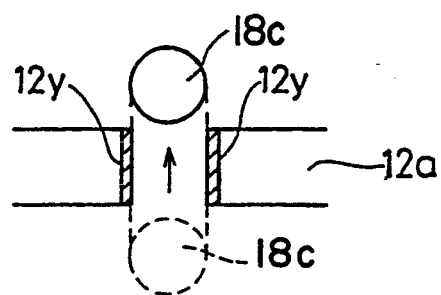
Figure 28C:
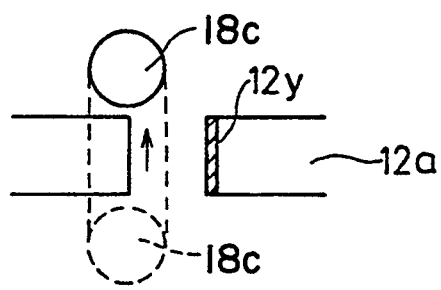
Figure 28D:
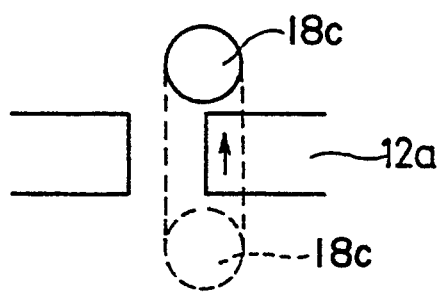

In a step S5, the stage part 22 is driven so that the cutting edge 18c is moved as far as a position (b) corresponding to the burr 12y, which position is adjacent to the position (a) shown in FIG. 28(B). In a step S6, the vertical moving mechanism 26b is driven so that the cutting edge 18c contacts the circuit board 23 with a second force $F_1'$ smaller than the first force $F_1$. In a step S7, ultrasonic energy is applied to the cutter 18 and the stage part 22 is driven at a second speed $V_2$ greater than the first speed $V_1$ so that the cutting edge 18c travels over the wiring pattern 12a. In the step S6, one row of a burr formed on the wiring pattern 12a is removed. The step S7 is executed following the step S6; the vertical moving mechanism 26b is driven so that the cutter 18 is raised and the cutting edge 18c is removed from the circuit board 23.

In a step S9, the stage part 22 is driven so that the cutting edge 18c is moved as far as a position (c) corresponding to the burr 12y, which position is adjacent to the position (a) shown in FIG. 28(B). In a step S10, the vertical moving mechanism 26b is driven so that the cutting edge 18c contacts the circuit board 23 with the second force $F_1'$ smaller than the first force $F_1$. In a step S11, ultrasonic energy is applied to the cutter 18, and the stage part 22 is driven at the second speed $V_2$ greater than the first speed $V_1$ so that the cutting edge 18c travels over the wiring pattern 12a. As a result of the step S11, the other row of a burr formed on the wiring pattern 12a is removed. A step S12 is executed following the step S11; the vertical moving mechanism 26b is driven so that the cutter 18 is raised and the cutting edge 18c is removed from the circuit board 23.

Because it is possible to set the force exerted by the cutter on the circuit board to be substantially small in the step S7 or in the step S11 of the above-described process, and because the cutting edge 18c is fed at a high speed, the cutting of the wiring pattern 12a is essentially prevented. In other words, an efficient exclusive removal of a burr not causing damage to the normal wiring pattern is possible by means of the process of this embodiment.

FIGS. 30(A)–30(D) show the circuit board trimming apparatus of a ninth embodiment of the present invention, and the circuit board trimming method using the apparatus.

Figure 30A:
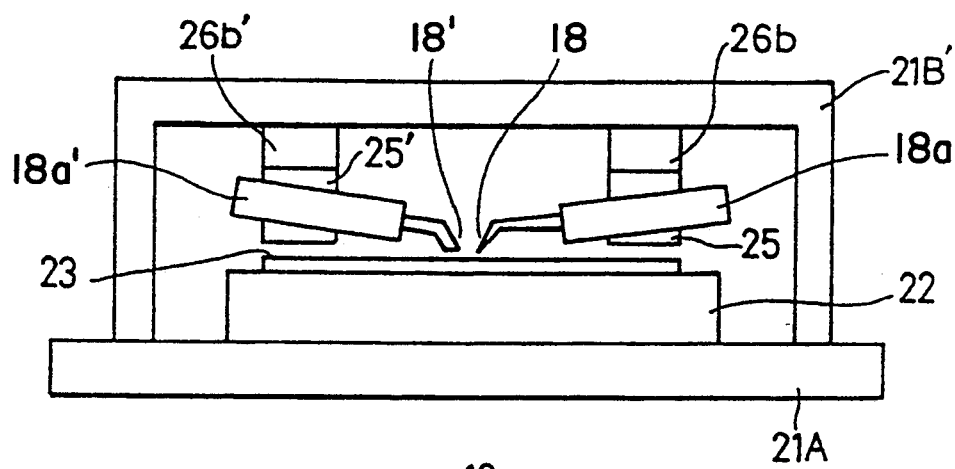
FIGS. 30(A) through 30(D) show a circuit board trimming apparatus and process of a ninth embodiment of the present invention.

Referring to FIG. 30(A), in the circuit board trimming apparatus of this embodiment, the cutter 18 is assembled to a U-shaped frame 21B' provided on the base 21A, via the force detecting mechanism 25 and the vertical moving mechanism 26b. Another cutter 18' of a similar configuration is assembled to the frame 21B' via another force detecting mechanism 25' and another vertical moving mechanism 26b'. The cutter 18 and the cutter 18' are provided so as to be opposite to each other. The cutting edge 18c' has a width W' larger than a width W of the cutting edge 18c. The width W corresponds to the width of the defective pattern 12x to be cut, as shown in FIGS. 30(B) and 30(C); the width W' is preset so that a width that includes the burr 12y is cut out, as shown in FIG. 31(D).

Figure 30B:
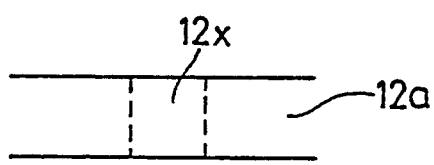
Figure 30C:
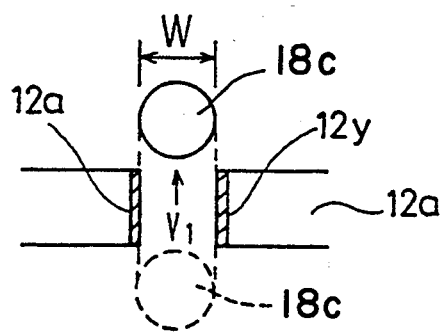
Figure 30D:
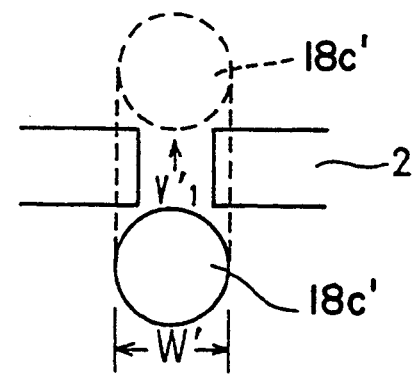

Referring to FIGS. 30(B)–30(D), the apparatus of the present invention cuts and removes the defective pattern 12x shown in FIG. 30(B), by applying the cutting edge 18c of the cutter 18 to the pattern with a first force $F_1$ and by moving the circuit board at a first speed $V_1$ As shown in FIG. 30(D), the burr 12y is removed by applying the cutting edge 18c' of the cutter 18' to the pattern with a second force $F_1'$ smaller than the force $F_1$ and by moving the circuit board with a speed $V_1'$ greater than the speed $V_1$. According to this embodiment, it is possible to remove the burr 12y in one cutting operation, thus improving efficiency of the circuit board trimming operation.

Figure 31:
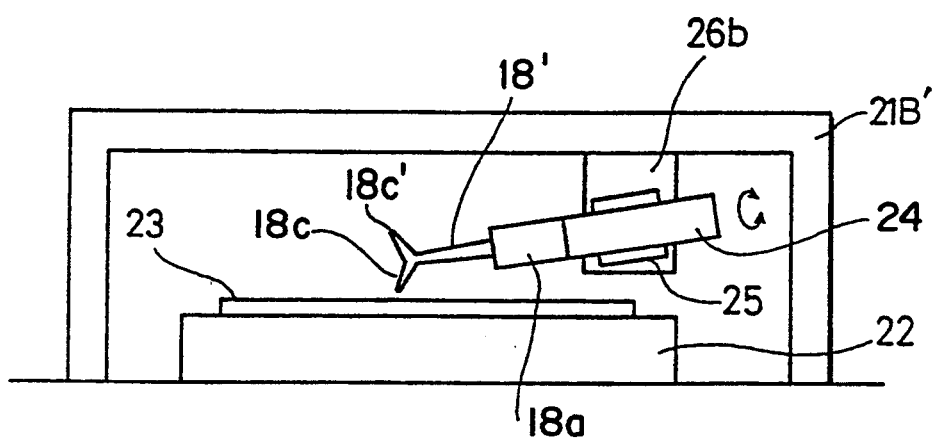
FIG. 31 shows a circuit board trimming apparatus of a tenth embodiment of the present invention.

FIG. 31 shows a configuration of the circuit board trimming apparatus of a tenth embodiment of the present invention.

Referring to FIG. 31, the apparatus of this embodiment uses the cutter 18 suspended from the frame 21B' via the vertical moving mechanism 26b, the force detecting mechanism 25 and the rotating mechanism 24, the rotating mechanism 24 supporting the cutter 18 in such a manner that the cutter 18 is rotatable with respect to the force detecting mechanism 25. The cutter 18 is constructed of the excitation part 18a, the oscillation transmitting part 18b, the cutting edge 18c and the cutting edge 18c'. The oscillation transmitting part 18b forks into two parts, each part having the respective cutting edge. The cutting edge 18c has the first width W shown in FIG. 30(C) and the cutting edge 18c' has the second width W' shown in FIG. 30(D).

When the circuit board is to be trimmed, the rotating mechanism 24 is driven first so that the first cutting edge 18c contacts the circuit board 23 and the defective pattern 12x is cut out by the width W. As in the case of FIG. 30(C), the force is set to be the first force $F_1$ and the cutting speed is set to be the first speed $V_1$. Next, the rotating mechanism 24 is driven again so that the first cutting edge 18c' contacts the circuit board 23, whereby, as in the case of FIG. 30(D), the force is set to be the second force $F_1'$ and the burr 12y is cut and removed at the second speed $V_1'$. Such configuration of the circuit board trimming apparatus ensures that the defective pattern on the circuit board can be efficiently trimmed.

A description will be given now, with reference to a flow chart of FIG. 32 and to FIG. 33(A)–33(C), of an eleventh embodiment of the present invention. While it is assumed in this embodiment that the apparatus of FIG. 10 will be used, this embodiment is not limited to the use thereof. In this embodiment, the cutter 18 having a specified width T is repeatedly fed widthways so that the pattern is removed by a width W greater than the width T.

Figure 32:
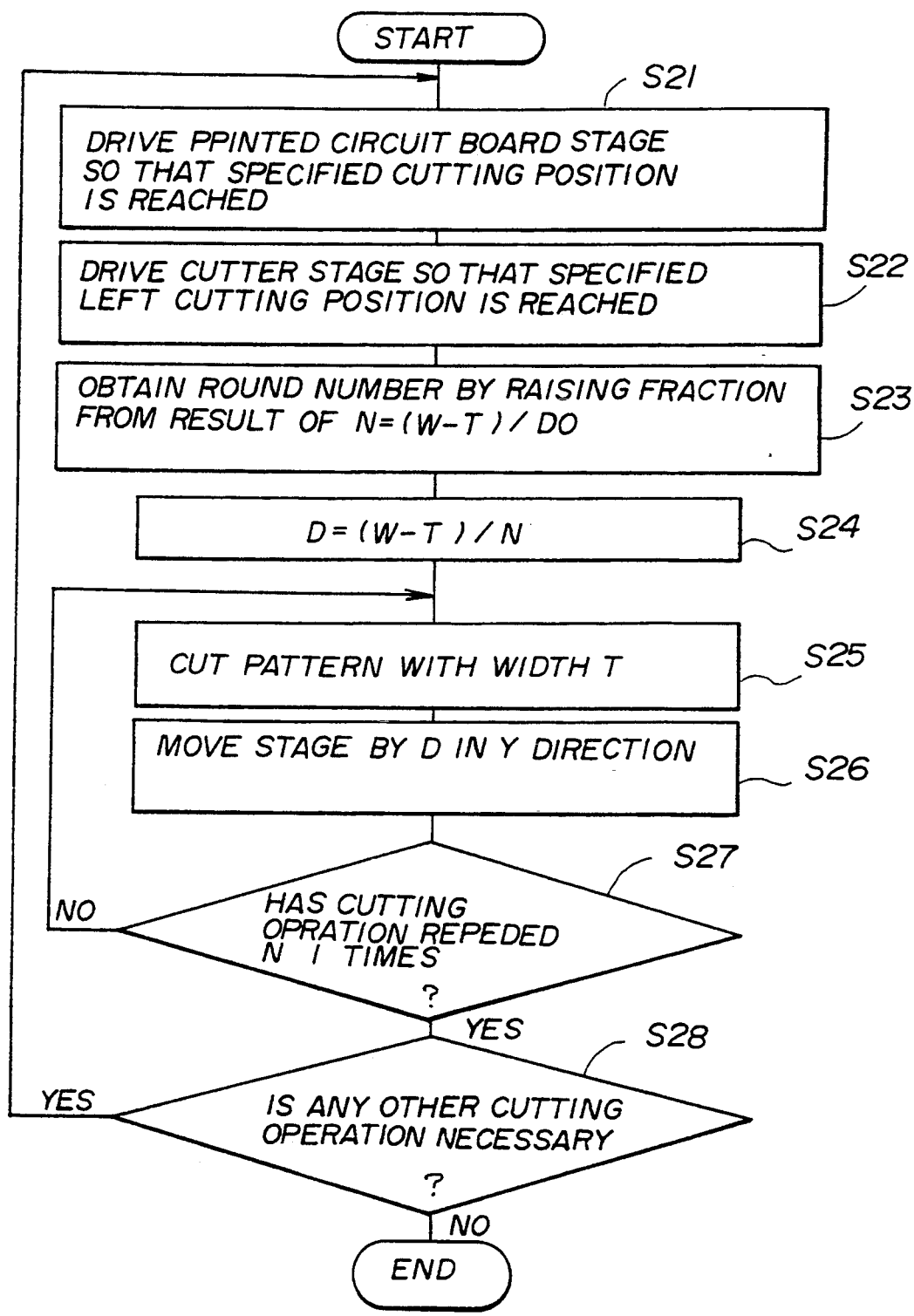
FIG. 32 is a flow chart of a circuit board trimming process of an eleventh embodiment of the present invention.

Referring to FIG. 32, in a step S21, the stage part 22 is driven so that the defective pattern 12x on the circuit board 23 is at a specified position. In a step S22, the stage 41 is driven so that the cutter 18 is at a specified position. In a step S23, a necessary number of times that the cutter is fed is computed on the basis of a preset unit feed $D_0$ in the widthwise direction of the cutter 18. In a step S24, a unit feed D is determined.

Figure 33A:
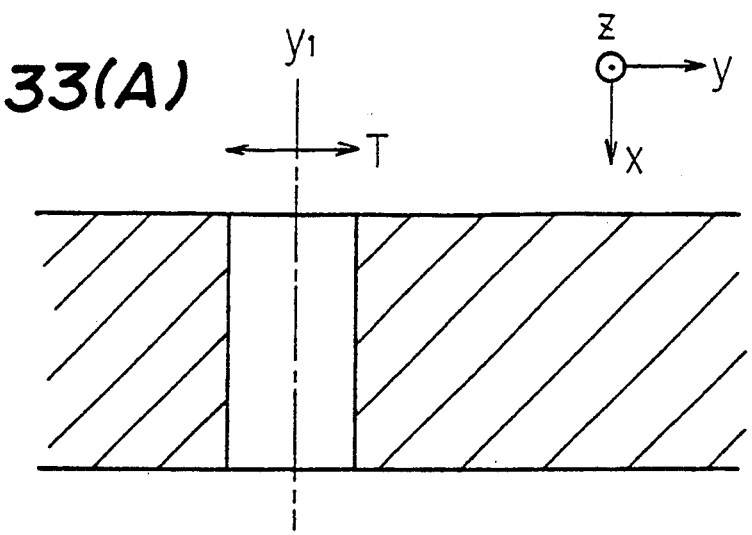
FIGS. 33(A) through 33(C) show a circuit board trimming process corresponding to the flow chart of FIG. 32.
Figure 33B:
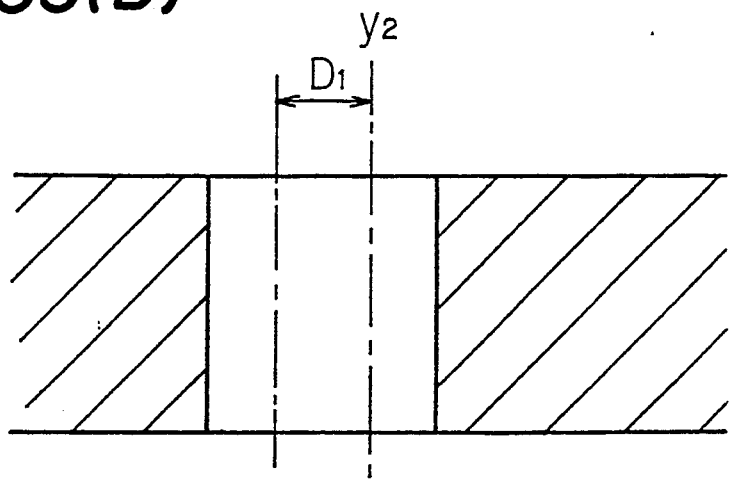
Figure 33C:
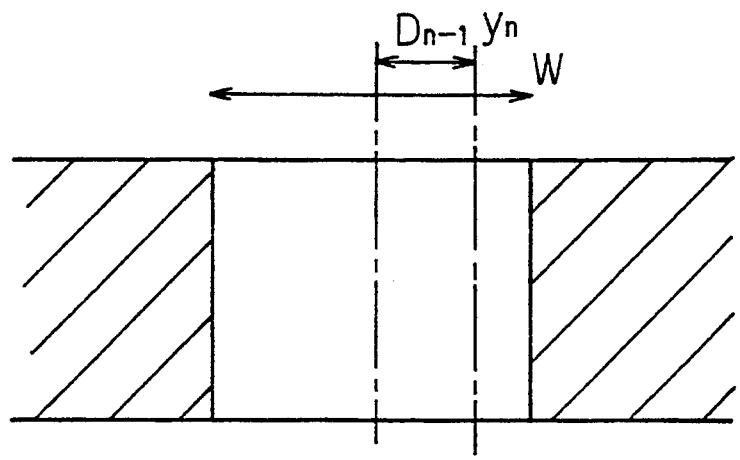

After the wiring pattern 12a is cut out by the width T as shown in FIG. 33(A), by moving the cutter 18 in a step S25, the cutter 18 is moved widthways (in the Y direction in the figure) by the feed D in a step S26 so that a cutting operation as shown in FIG. 33(B) is performed. The steps S25 and S26 are repeated and if it is determined in a step S27 that the number of times that the cutting operation is repeated has reached N+1, it is determined that the defective pattern 12x has been trimmed. A determination is made in a step S28 as to whether or not there is any other defective pattern to be trimmed. If there is, the steps including and following the step S21 are repeated.

FIG. 34 shows a configuration of the circuit board trimming apparatus used in a twelfth embodiment of the present invention. In the figure, those parts that have been heretofore described are given the same reference numerals from figure to figure and the description thereof is omitted.

Referring to FIG. 34, this embodiment uses the apparatus described with reference to FIG. 14. The pattern is cut out by a width greater than the width T of the cutting edge of the cutter 18, by oscillating the cutter stage 41 widthways at a rapid rate. For example, when a cutting operation is performed in the X direction, the stage 41 is oscillated in the Y direction at a rapid rate. For this purpose, a driving unit 26h controlled by the controlling unit 28 is provided, the unit 26h oscillating the stage 41 i.e. the cutter 18 in the Y direction, for example, at a speed of approximately 1000 μm/sec. The amplitude of the oscillation of the stage 41 in the Y direction is preset so as to correspond to the width W of the defective pattern 12x to be cut. For example, when the defective pattern having a width W of 25 μm is to be cut out using the cutting edge 18c having the width T of 10 μm, an amplitude S is calculated to be 7.5 μm as per $$S = (W - T)/2$$

The speed of oscillation in the Y direction is preset to be sufficiently greater than the feed speed in the X direction X. For example, it is preset to be about ten times that of the feed speed in the X direction. However, the oscillating rate is preset to be smaller than the ultrasonic oscillation rate. When, for example, the feed speed in the X direction is around 100 μm/sec, the oscillating rate is about 1000 μm/sec. Given the amplitude S of 7.5 μm, the stage 41 and the cutter 18 are oscillated at a frequency of about 33 kHz in the Y direction. It is required that the stage 41 have response characteristics permitting such a high rate of oscillation to be maintained. The stage 41 may therefore be constructed of a piezoelectric vibrator.

Figure 35:
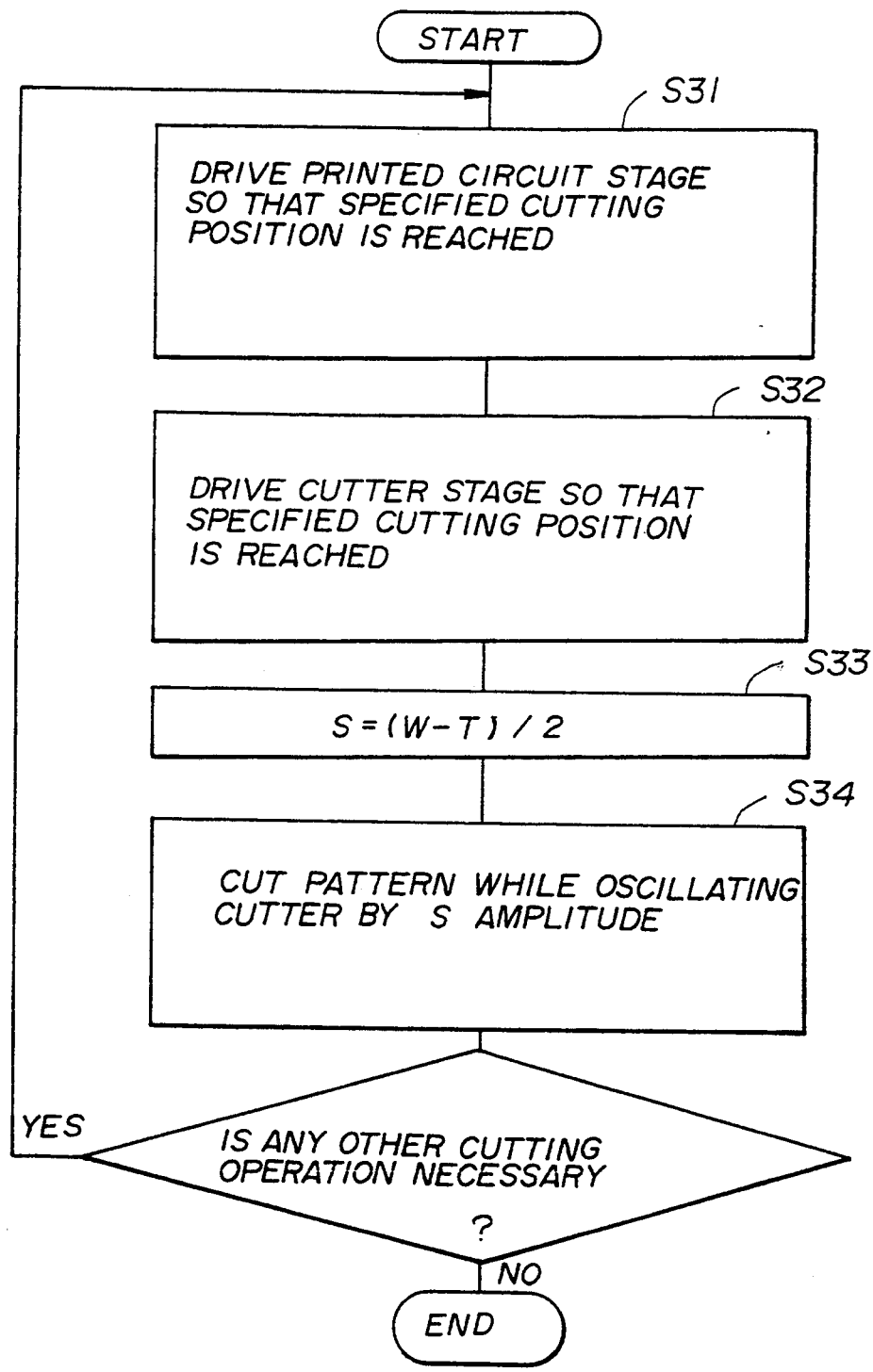
FIG. 35 is a flow chart of a circuit board trimming process performed by using the circuit board trimming apparatus of FIG. 34.

FIG. 35 is a flow chart of operations when the defective pattern is cut out by using the apparatus of this embodiment.

Referring to FIG. 35, in a step S31, the stage part 22 is driven so that the defective pattern 12x on the circuit board 23 is moved to a specified cutting position. Then, in a step S32, the cutter 18 is moved to a specified position so as to be aligned with the defective pattern to be cut. In a step S33, the amplitude S is determined from the width T of the cutting edge 18c and from the width W of the pattern to be cut. In a step S34, the pattern 12x is cut out while the cutter 18 is oscillated at the amplitude S. If it is found in a step S35 that there is another pattern to be cut, the steps including and following the step S31 are repeated.

Figure 36A:
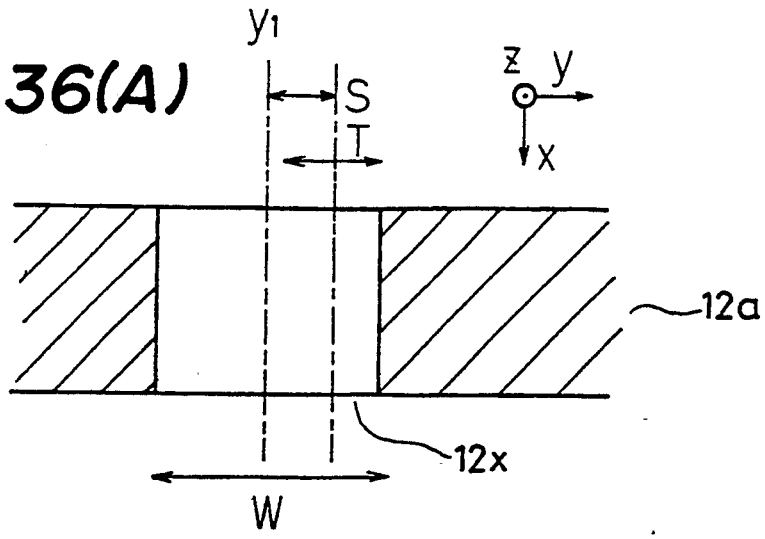
FIGS. 36(A) through 36(C) show a circuit board trimming process of the twelfth embodiment of the present invention, which process correspond to the flow chart of FIG. 35.
Figure 36B:
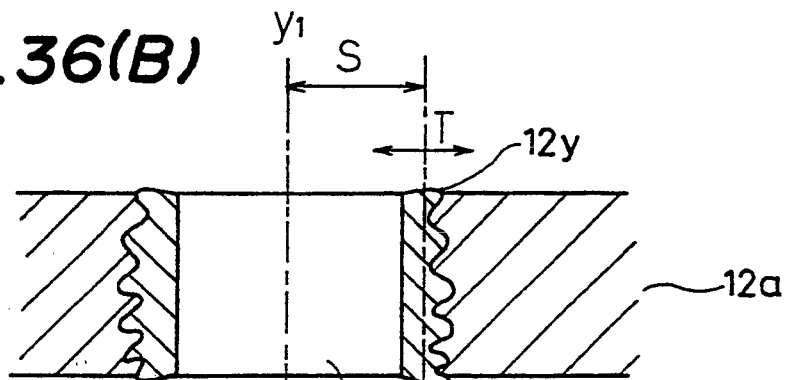
Figure 36C:
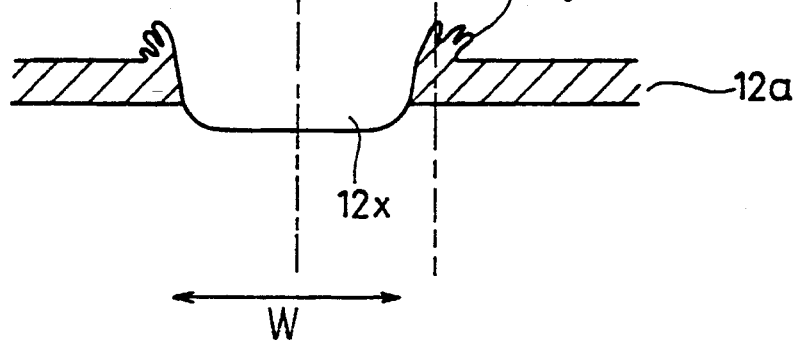

The process of FIG. 35 is also effective in removing the burr 12y formed as the pattern 12x is being cut out and shown in FIGS. 36(B) and 36(C). When the burr is to be cut, the cutting edge 18c is raised to a height corresponding to the burr after the pattern 12x is cut out by the width W. It is possible to cut out the burr 12y by presetting the amplitude S of the oscillation applied by the driving unit 26h to be W/2 and by running the cutting edge 18c again in the X direction.

A description will now be given, with reference to FIG. 37 and FIGS. 38(A)–38(C), of a thirteenth embodiment of the present invention.

Figure 38A:
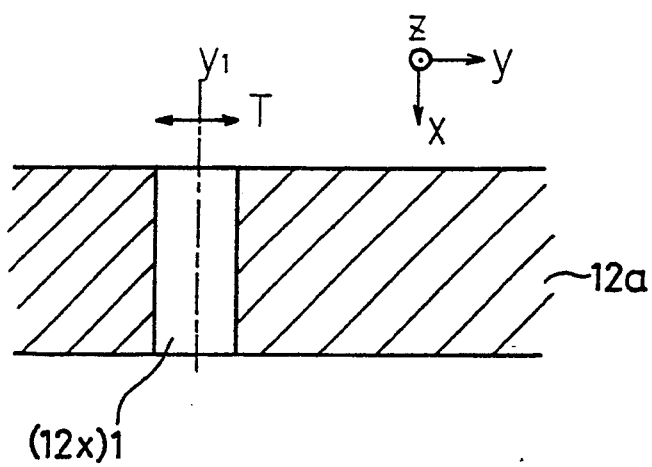
FIGS. 38(A) through 38(C) show a circuit board trimming process corresponding to FIG. 37.
Figure 38B:
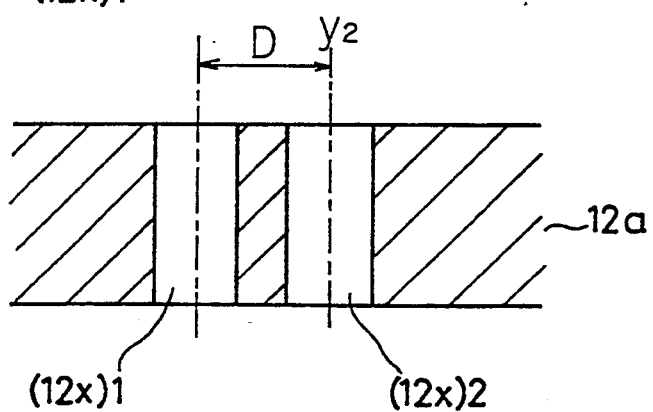
Figure 38C:
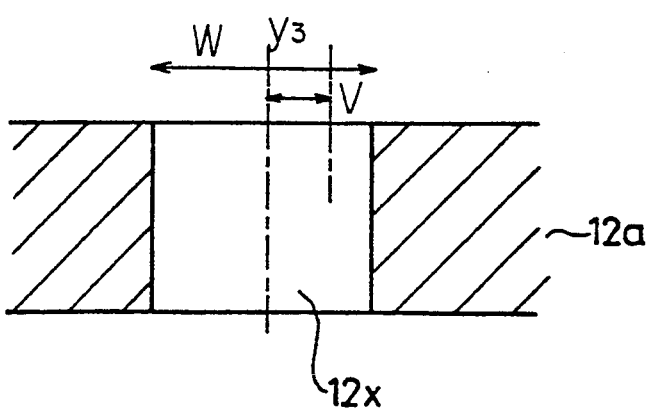

Referring to FIG. 38(A) first, the wiring pattern 12a is cut out by the width T, by positioning, at a position $Y_1$, the cutter 18 having the cutting edge 18c of the width T and by feeding the circuit board 23 in the X direction. As a result, an area $(12x)_1$ is formed. As shown in FIG. 38(B), the cutter 18 is moved to a position $Y_2$ removed by a distance D from the position $Y_1$ in the Y direction, and the wiring pattern 12a is cut out by the width T by moving the circuit board 13 in the X direction. As a result, an area $(12x)_2$ is formed as shown in FIG. 38(B), and an unremoved area is formed between the area $(12x)_1$ and the area $(12x)_2$. Thereafter, as shown in FIG. 38(C), the cutter 18 is moved to a position $Y_3$, the circuit board 23 is moved in the X direction, and the cutting edge 18c is oscillated in the Y direction at an amplitude corresponding to the distance D, while ultrasonic oscillation is not applied to the cutter. The unremoved area can be removed by moving the circuit board 23 in the X direction in this condition.

Figure 37:
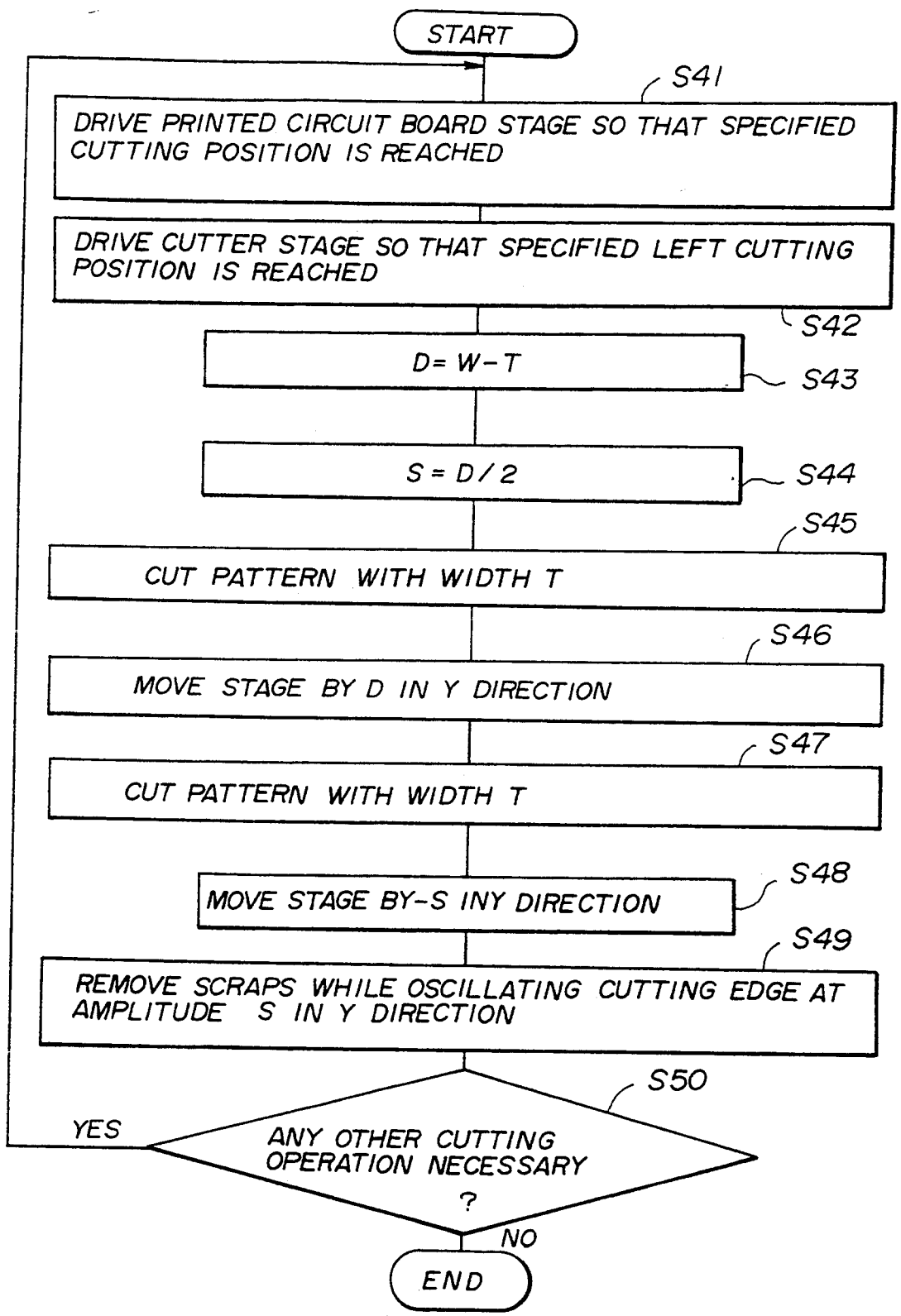
FIG. 37 is a flow chart of a circuit board trimming process of a thirteenth embodiment of the present invention.

Referring to FIG. 37, in steps S41 and S42, the stage part 22 and the stage 41 are driven so that the defective pattern 12x to be cut out is aligned with the cutting edge 18c of the cutter. In a step S43, the width D is obtained as per $$D = W - T$$

In a step S44, the amplitude S is determined. In a step S45, the wiring pattern 12a is cut out in the area $(12x)_1$ by the width T of the cutting edge 18c. In a step S46, the cutting edge 18c is moved by the distance D in the Y direction. In a step S47, the wiring pattern 12a is cut out by the width T in the area $(12x)_2$. Further, the cutting edge 18c is moved by the distance −S in the Y direction. In a step S49, the unremoved area between the areas $(12x)_1$ and $(12x)_2$ is removed by oscillating the cutting edge 18c at the amplitude S. A determination is made in a step S50 as to whether or not there is any other pattern to be cut.

It is experimentally found in this embodiment that ultrasonic energy should not necessarily be applied by means of the ultrasonic oscillation unit 18a in the step S49 and that, when applying the same, the power of ultrasonic energy can be at a reduced level. While the areas $(12x)_1$ and $(12x)_2$ overlap and no unremoved area is formed when the relationship D<T holds, the step S48 is effective in removing scraps even in such a case.

According to the methods of eleventh through thirteenth embodiments, an efficient cutting operation is possible without exchanging cutters even when the width of the defective pattern 12x to be cut out is greater than the width of the cutting edge 18c of the cutter, thereby greatly improving efficiency of the circuit board trimming process. While a cutter having a width corresponding to the width of the pattern to be cut out is not readily available, these embodiments can overcome such a problem. Requirement for precision of the cutting edge 18c is not so exact, and a more or less worn cutting edge can perform a cutting operation of desired precision. It is thus possible to lower the running cost of the apparatus.

Figure 39:
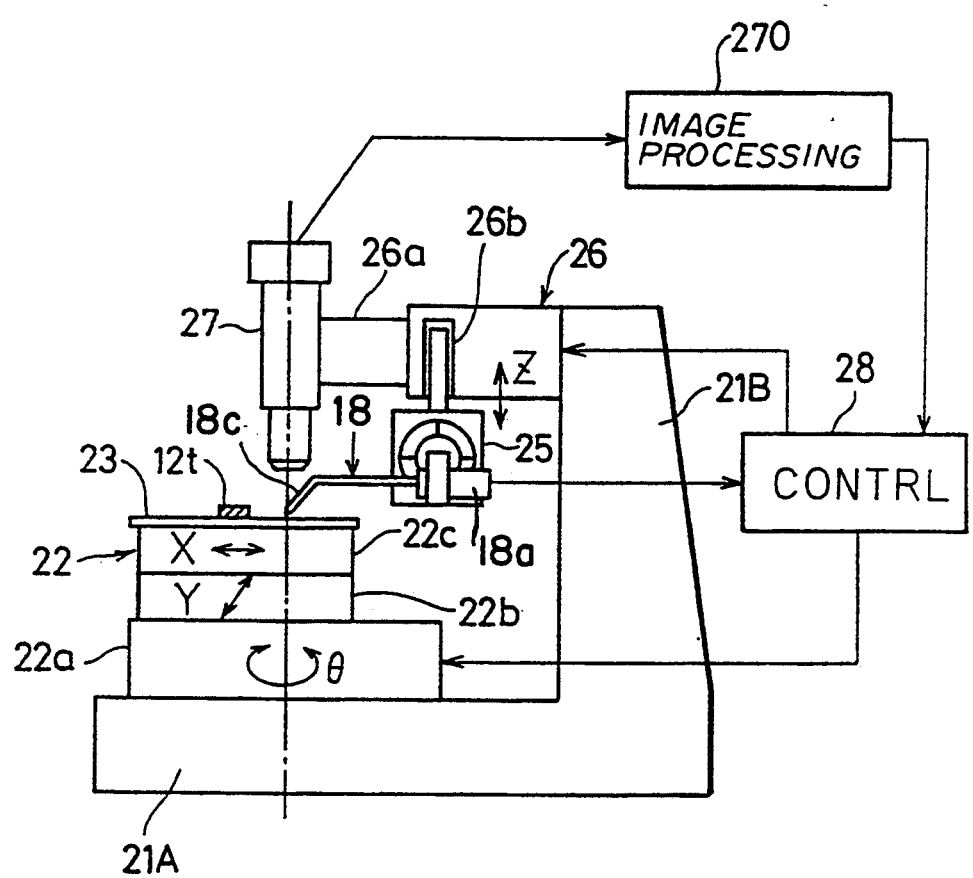
FIG. 39 shows a circuit board trimming apparatus of a fourteenth embodiment of the present invention.
Figure 40:
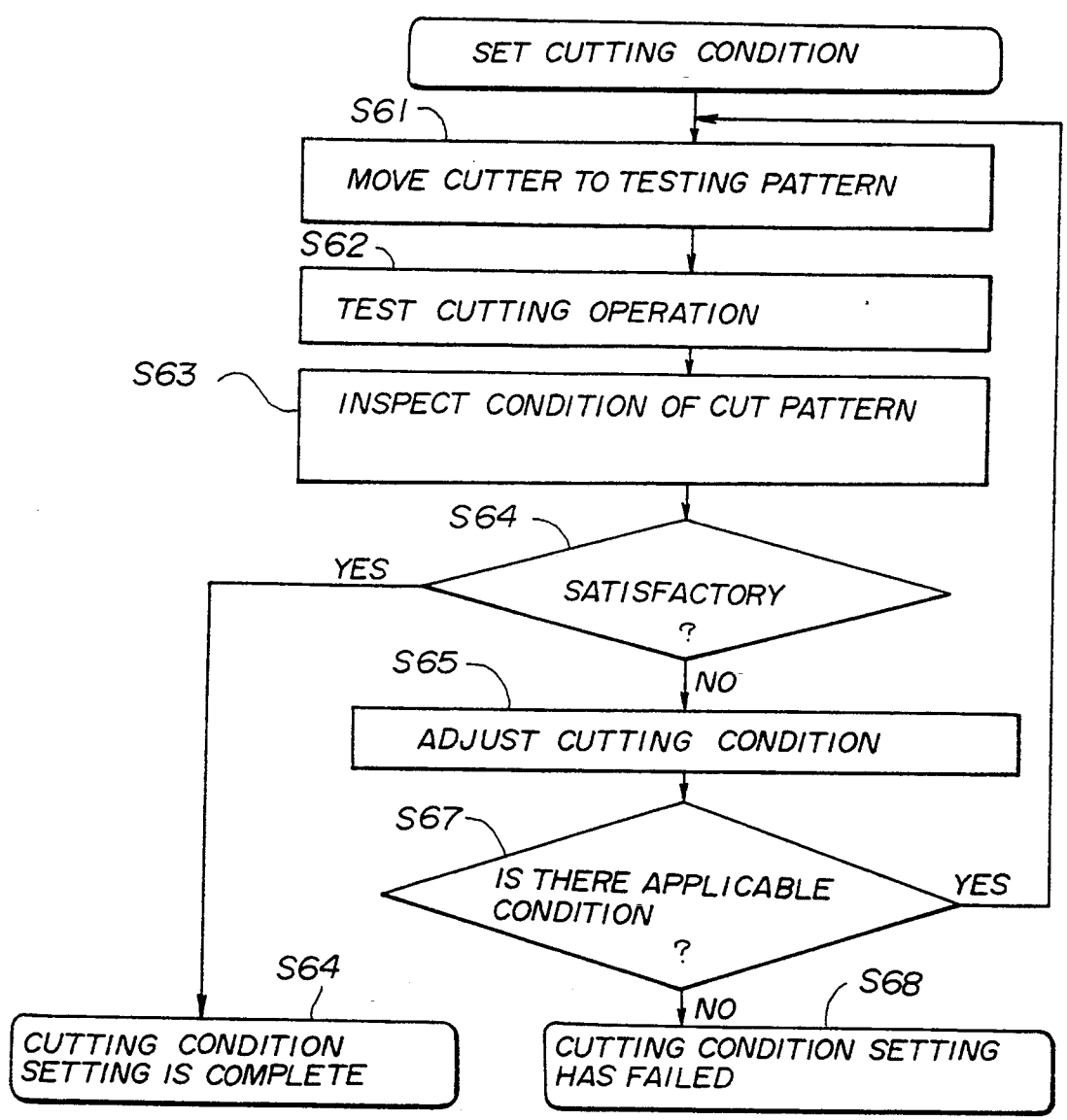
FIG. 40 is a flow chart of a circuit board trimming process of the fourteenth embodiment of the present invention, which process uses the apparatus of FIG. 37.

A description will now be given, with reference to FIGS. 39 and 40, of a fourteenth embodiment of the present invention. FIG. 39 shows the circuit board trimming apparatus used in this embodiment and FIG. 40 is a flow chart. In FIG. 39, those parts heretofore explained are given the same reference numerals from figure to figure, and the description thereof is omitted.

In this embodiment, the variation of the condition of the cutting edge 18c, which variation arises as the circuit board trimming apparatus is repeatedly used, as well as the resultant variation of the cutting characteristic are detected. The cutting condition is adjusted so as to cancel the variations. Referring to FIG. 39, in this embodiment, a test pattern 12t having a specified shape and dimension is formed on the circuit board 23, and the cutter 18 is allowed to cut out the test pattern 12t. The cut out test pattern 12t is inspected under the microscope 27. The resultant microscopic image is processed in a image processing unit 270 and the controlling unit 28 determines the result of the cutting test. If the result of cutting is unsatisfactory, the cutting condition is adjusted. For this purpose, the microscope 27 is provided with a video camera.

Referring to FIG. 40, in a step S61, the circuit board 23 is moved with respect to the cutter by driving the stage part 22, and the test pattern 12t on the circuit board 23 is aligned with the cutting edge 18c of the cutter 18. In a step S62, the test pattern 12x is cut out under a specified cutting condition. In a step S63, the result of the test cutting is examined. In the step S64, the image of the pattern 12t obtained through the microscope 27 is analyzed so as to find out the cutting width, the cutting depth, the size of the burr and the irregularity of the cut surface.

If it is found in the step S64 that the result of cutting is satisfactory, no adjustment of the cutting condition is necessary, and the process of FIG. 40 ends with the step S64. If the result of cutting is unsatisfactory, the step S65 is executed, and the force, ultrasonic energy and the feed speed are modified. Generally speaking, when it is determined in the step S63 that the cutting depth is not sufficient, the following adjustments are made through the controlling unit 28 in the stated order: (1) increase ultrasonic energy; (2) increase the force; and (3) reduce the feed speed. When, conversely, the cutting depth is excessive, the following adjustments are made in the stated order: (1) reduce ultrasonic energy; (2) reduce the force; and (3) increase the feed speed Further the cutting width T is measured, and the number of times N or the feed D is adjusted so as to provide appropriate widthways feed, as described in the description of the embodiment of FIG. 32. When the size of the burr is excessive, such adjustment as reduction of the force or reduction of ultrasonic energy is executed.

When it is found in a step S67 that there is room for adjustment, the steps including and following the step S61 are repeated. When, conversely, there is no room for adjustment, a flag indicating a failure of adjustment is generated in a step S68 and the process is terminated.

As has been described, this embodiment allows the cutting condition to be determined as it varies in correspondence to the variation of the condition of the cutting edge, thereby making it possible to maintain the circuit board trimming apparatus at an optimal working condition.

According to the present invention, in which the circuit board trimming apparatus is configured such that force exerted by the ultrasonic cutter against the circuit board is measured, it is possible to perform an optimal trimming operation in accordance with the shape of the defective pattern to be trimmed, while damage to the circuit board is minimized. For example, it is possible, by measuring the force of the cutter, to determine the shape of the defective pattern and thus to minimize damage to the circuit board by varying a spatial cutting range while the trimming process is proceeding. It is also possible to perform a cutting operation in such a manner that the shape of the circuit board is traced even when the surface of the circuit board is slanted or when the defective pattern is formed on a depression. In the case that a burr is formed as a result of a cutting operation of the defective pattern, the burr can be cut out without causing damage to the trimmed pattern, by utilizing a cutting condition different from the one used to cut out the pattern. It is also possible, by oscillating the cutting edge widthways, to cut out the pattern by a width greater than the width of the pattern to be trimmed, without exchanging the cutting edge. It is also possible, by cutting out a test pattern having a specified shape and by inspecting the condition of the cutting edge, to make the cutting condition to be always adapted to the condition of the cutting edge.

The present invention is not limited to the above described embodiments, and variations and modifications may be made without departing from the scope of the present invention.

What is claimed is:

1. A circuit board trimming apparatus comprising:
supporting means for supporting a circuit board;
a cutter for cutting, after contacting a wiring pattern formed on the surface of said circuit board, the wiring pattern;
driving means for relatively moving said cutter and supporting means so that said supporting means moves with respect to said cutter in such a manner that the supporting means moves in a direction at right substantially perpendicular to the surface of said circuit board;
and oscillating means for supplying ultrasonic oscillation to said cutter,
said apparatus trimming a defect in a wiring pattern formed on the circuit board by relatively moving said cutter and circuit board and by cutting the wiring pattern on the circuit board,
said circuit board trimming apparatus further comprising:
detecting means for detecting a force applied by said cutter against said circuit board and for outputting an output signal indicative of said force; and
controlling means which, supplied with said output signal, controls said driving means on the basis of said output signal so as to control said force.

2. The circuit board trimming apparatus as claimed in claim 1, wherein said detecting means comprises a torque sensor for detecting a torque applied to said cutter, said torque being caused by the relative movement of said cutter and said printed wiring board and the force applied by the cutter against the printed wiring board.

3. The circuit board trimming apparatus as claimed in claim 2, wherein said torque sensor comprises:
- a crossed spring suspension mechanism for suspending said cutter; and
- a strain gauge which, attached to each spring forming said crossed spring mechanism, detects strain of the spring.

4. The circuit board trimming apparatus as claimed in claim 3, wherein said supporting means has a main surface for supporting the circuit board, and comprises:
- a mechanism for moving the circuit board in two directions perpendicular to each other, the directions being parallel to said main surface of the circuit board; and
- a mechanism for rotating the circuit board about an axis extending perpendicular to said main surface.

5. The circuit board trimming apparatus as claimed in claim 1, further comprising a second cutter which, after contacting the wiring pattern formed on said circuit board, cuts the wiring pattern, said second cutter having a cutting edge with a width which is larger than a width of a cutting edge of said first cutter.

6. The circuit board trimming apparatus as claimed in claim 5, further comprising a second detecting means for detecting a force exerted by said second cutter against said circuit board and for outputting a second output signal indicative of said force.

7. The circuit board trimming apparatus as claimed in claim 1, wherein said cutter comprises:
- a first cutting edge having a first width;
- a second cutting edge having a second width larger than said first width;
- a cutter arm to which said first and second cutting edges are commonly connected; and
- driving means for rotating said cutter arm so that either said first or second cutting edge selectively contacts said circuit board.

8. The circuit board trimming apparatus as claimed in claim 1, wherein said oscillating means applies an ultrasonic oscillation to said cutter so as to oscillate it in a cutting direction, and said circuit board trimming apparatus comprises second oscillating means for oscillating said cutter in a direction substantially parallel to the surface of said circuit board and in a direction substantially perpendicular to said cutting direction.

9. The circuit board trimming apparatus as claimed in claim 8, wherein said second oscillating means applies to said cutter oscillation substantially perpendicular to said cutting direction at a rate slower than oscillation applied by said first oscillating means to said cutter.

10. The circuit board trimming apparatus as claimed in claim 9, wherein a speed of oscillation applied by said second oscillating means to said cutter is larger than a relative moving speed of said cutter and said circuit board while said wiring pattern is being cut.

11. The circuit board trimming apparatus as claimed in claim 1, wherein said controlling means comprises determining means for determining, on the basis of said output signal indicative of the force, a shape of said wiring pattern to be cut.

12. The circuit board trimming apparatus as claimed in claim 11, wherein said determining means determines said shape on the basis of said force and on the basis of a spring constant of said detecting means.

13. The circuit board trimming apparatus as claimed in claim 1, wherein said controlling means comprises force controlling means for driving said driving means in a direction substantially perpendicular to a main surface of said circuit board and for controlling said force, said force controlling means comprising:
- contact detecting means for detecting a contact between said cutter and said circuit board;
- target setting means for obtaining, when said contact detecting means detects a contact between said cutter and circuit board, a target driving amount of said driving means corresponding to a specified target force; and
- stopping means for stopping said driving means when said driving amount has reached said target driving amount.

14. The circuit board trimming apparatus as claimed in claim 13, wherein said controlling means comprises force controlling means for driving said driving means in a direction substantially perpendicular to a main surface of said circuit board and for controlling said force, said force controlling means comprising deceleration detecting means for decelerating a driving speed of the cutter with respect to said circuit board, when a contact between said cutter and said circuit board is detected.

15. A circuit board trimming method comprising the steps of:
- (a) pressing a cutter excited with an ultrasonic oscillation, against a wiring pattern formed on the surface of a circuit board; and
- (b) cutting a defect included in said wiring pattern by moving said cutter with respect to said circuit board in a direction parallel to a main surface of said circuit board, while said cutter is being pressed against said circuit board,
- said pressing step including a step of measuring a force exerted by said cutter on the surface of said circuit board, and
- said cutting step including a step of controlling said force to be at a specified level.

16. The circuit board trimming method as claimed in claim 15, wherein said pressing step comprises a step of detecting a contact between said cutter and circuit board on the basis of a result of measurement of said force, and
- said controlling step sets said force at said specified level when a contact is detected in said contact determining step.

17. The circuit board trimming method as claimed in claim 16, wherein said cutting step comprises a step of rotating said circuit board with respect to the main surface of said circuit board around a substantially vertical hypothetical axis,
- said pressing step comprises a step of pressing said cutter against said circuit board at a position removed from said hypothetical axis, and
- said cutting step is executed while said cutter presses said circuit board at a position removed from said hypothetical axis.

18. The circuit board trimming method as claimed in claim 15, wherein said pressing step comprises the steps of:
- (a) bringing a stage supporting said cutter closer to the main surface of said circuit board;
- (b) detecting a contact between said cutter and circuit board;
- (c) determining a coordinate, on an axis perpendicular to the surface of said circuit board, of said stage, when a contact is detected between said circuit board and cutter;

(d) determining, on the basis of a spring constant k of said cutter, a target coordinate of the stage at which coordinate a desired force is obtained between said cutter and circuit board; and (e) moving the stage as far as said target coordinate.

19. The circuit board trimming method as claimed in claim 18, wherein said pressing step comprises the steps of:

(a) bringing the stage supporting said cutter closer to the main surface of said circuit board at a specified speed;

(b) detecting a contact between said cutter and circuit board; and (c) decelerating a speed of said stage with respect to the surface of said circuit board to be lower than said specified speed, when a contact between said circuit board and cutter is detected.

20. The circuit board trimming method as claimed in claim 15, wherein said pressing step comprises the steps of:

(a) bringing the stage supporting said cutter closer to the main surface of said circuit board;

(b) detecting a contact between said cutter and circuit board;

(c) determining a coordinate on an axis perpendicular to the surface of said circuit board, of said stage, when a contact between said circuit board and cutter is detected, and said cutting step comprises the steps of:

(a) determining a coordinate, on an axis perpendicular to the surface of said circuit board, of said stage after a cutting operation; and (b) determining a cutting amount from the coordinate reached after said cutting operation, said cutting operation is repeated until said cutting amount reaches a specified value.

21. The circuit board trimming method as claimed in claim 15, wherein said cutting step comprises a step of measuring a distribution of the force of said cutter when moving said cutter and circuit board with respect to each other in a direction parallel to the main surface of said circuit board, while said cutter is pressed against said circuit board and of determining a shape of said wiring pattern on the basis of the distribution of said force.

22. The circuit board trimming method as claimed in claim 21, wherein the distribution of said force is a distribution of a maximum force.

23. The circuit board trimming method as claimed in claim 21, wherein said cutting operation is repeated until the maximum value of the distribution of said force falls below a specified force.

24. The circuit board trimming method as claimed in claim 23, wherein a range in the distribution of said force is detected, in which range the force exceeds a specified force, whenever said cutter and circuit board are moved with respect to each other in a direction parallel to the main surface of said circuit board, while said cutter is pressed against said circuit board, the cutting operation being repeated in a detected range.

25. The circuit board trimming method as claimed in claim 15, wherein there is included a step of measuring a shape of the wiring pattern formed on the main surface of said circuit board by contacting said cutter with said circuit board while ultrasonic oscillation is not applied, and by measuring a distribution of the force exerted on the cutter as the cutter is moved along the main surface of said circuit board.

26. The circuit board trimming method as claimed in claim 15, wherein said cutting step comprises a first step of cutting the wiring pattern with a first force and a second step of cutting a burr formed as a result of said first step with a second force smaller than said first force.

27. The circuit board trimming method as claimed in claim 26, wherein, the cutter is moved with respect to the circuit board at a higher speed in said second step than in said first step.

28. The circuit board trimming method as claimed in claim 15, wherein there is further included a step of determining: the number of times required for a cutting operation to be performed in order to achieve said desired cutting width; and a moving amount by which said cutter is moved widthways in one cutting operation, on the basis of a width by which the wiring pattern is cut in one cutting operation as the cutter is moved in a direction parallel to the main surface of said circuit board, and on the basis of a desired cutting width, said cutting step being executed by repeating a step of moving said cutter with respect to said circuit board, in such a manner that each new cutting operation is executed after said cutter is moved widthways by said moving amount.

29. The circuit board trimming method as claimed in claim 15, wherein said cutting step is executed while said cutter is oscillated widthways.

30. The circuit board trimming method as claimed in claim 29, wherein said cutter is oscillated widthways at a speed smaller than a speed of said ultrasonic oscillation but greater than a speed of said cutter relative to said circuit board.

31. The circuit board trimming method as claimed in claim 29, wherein said cutter is oscillated widthways at an amplitude corresponding to a width by which the wiring pattern is to be cut.

32. The circuit board trimming method as claimed in claim 15, wherein there are further included the steps of (a) cutting, for a test purpose, a pattern having a specified shape with a cutter;

(b) inspecting the pattern cut in said test cutting step; and (c) adjusting a cutting condition on the basis of the result of said test cutting step.

33. The circuit board trimming method as claimed in claim 32, wherein adjustment of said cutting condition is executed in the following order: adjustment of ultrasonic oscillation energy; adjustment of force; and adjustment of relative speed of a motion of the cutter with respect to the circuit board.

* * * * *